(12) United States Patent
Ozen et al.

(10) Patent No.: US 9,625,551 B2
(45) Date of Patent: Apr. 18, 2017

(54) MAGNETIC RESONANCE APPARATUS AND DATA ACQUISITION METHOD WITH DECOUPLING BETWEEN TRANSMIT AND RECEIVE COILS

(71) Applicants: Ali Caglar Ozen, Sehitkamil/Gaziantep (TR); Ergin Atalar, Cankaya/Ankara (TR)

(72) Inventors: Ali Caglar Ozen, Sehitkamil/Gaziantep (TR); Ergin Atalar, Cankaya/Ankara (TR)

(*) Notice: Subject to any disclaimer, the term of this patent is extended or adjusted under 35 U.S.C. 154(b) by 1038 days.

(21) Appl. No.: 13/863,530

(22) Filed: Apr. 16, 2013

(65) Prior Publication Data
US 2013/0271135 A1 Oct. 17, 2013

Related U.S. Application Data

(60) Provisional application No. 61/624,473, filed on Apr. 16, 2012.

(51) Int. Cl.
| | |
|---|---|
| *G01V 3/00* | (2006.01) |
| *G01R 33/54* | (2006.01) |
| *G01R 33/36* | (2006.01) |
| *G01R 33/48* | (2006.01) |
| *G01R 33/561* | (2006.01) |

(52) U.S. Cl.
CPC ....... *G01R 33/543* (2013.01); *G01R 33/3657* (2013.01); *G01R 33/4816* (2013.01); *G01R 33/4824* (2013.01); *G01R 33/5612* (2013.01)

(58) Field of Classification Search
CPC .................................................. G01R 33/3657
USPC ........................................ 324/318, 322, 314
See application file for complete search history.

(56) References Cited

U.S. PATENT DOCUMENTS

| | | | | |
|---|---|---|---|---|
| 2001/0019264 | A1* | 9/2001 | Shattil | H05K 9/00 324/225 |
| 2009/0302841 | A1* | 12/2009 | Avdievich | G01R 33/3415 324/309 |
| 2013/0207660 | A1* | 8/2013 | Lips | G01R 33/3657 324/322 |
| 2014/0139218 | A1* | 5/2014 | Findeklee | G01R 33/3628 324/318 |

OTHER PUBLICATIONS

Haydar Celik, MS Thesis, Bilkent University, Novel RF Coil Technologies for MRI. Jun. 2006.
(Continued)

*Primary Examiner* — Louis Arana
(74) *Attorney, Agent, or Firm* — Schiff Hardin LLP

(57) ABSTRACT

In magnetic resonance data acquisition, decoupling between the transmit and receive coils is achieved by using a transmit array system wherein induced currents from the transmit coils cancel each other, resulting in a total of zero current in the receive coil. Forward and reversed polarized transmit coil pairs are set to cancel the individual currents of each other, or of a receive coil. Linearly polarized fields can also be used to effect the decoupling. The decoupling allows the magnetic resonance data acquisition system to be operated for concurrent excitation of the nuclear spins and reception of the resulting magnetic resonance signals.

16 Claims, 14 Drawing Sheets

(56) References Cited

OTHER PUBLICATIONS

Schneider, E., Prost, R. W. and Glover, G. H. (1993), Pulsed magnetization transfer versus continuous wave irradiation for tissue contrast enhancement. J. Magn. Reson. Imaging, 3: 417-423. doi: 10.1002/jmri.1880030218.

Ulmer, J. L., Mathews, V. P., Moran, P. R. (1996), Magnetization Transfer or Spin-Lock? An Investigation of Off-Resonance Saturation Pulse Imaging with Varying Frequency Offsets, Journal of Magnetic Resonance, 163: 318-324.

Borthakur, A., Sochor, M., Clark, C. M. (2008), T1τ MRI of Alzheimer's disease, NeuroImage, 41:1199-1205.

Kotler, S., Akerman, N., Keselman, A., Ozeri R. (2011), Single-ion quantum lock-in amplifier, Nature, 473: 61-65. doi: 10. 1038/nature10010.

Sipila, P., Wachutka, G., Wiesinger, F. Coherent excitation scheme to operate pulsed NMR probes for real-time magnetic field monitoring, In: Proceedings, 17th Annual Meeting of ISMRM, 2009.

Tyler DJ, Robson MD, Henkelman RM, Young IR, Bydder GM. Magnetic resonance imaging with ultrashort TE (UTE) pulse sequences: technical considerations. J Magn Reson Imaging 2007;25:279-289.

Brunner, D. O., Pavan, M., Dietrich, B., Heller, A., Pruessmann, K. P. Sideband Excitation for Concurrent RF Transmission and Reception, In: Proceedings, 19th Annual Meeting of ISMRM, 2011.

Idiyatullin, D., Suddarth, S., Corum, C., Adrainy, G., Garwood, M. Continuous SWIFT, In: Proceedings, 19th Annual Meeting of ISMRM, 2011.

Eryaman Y., Akin, B., Atalar, E. Reduction of Implant RF heating, MRM 2010.

Halise Irak, MS Thesis Bilkent University, Modeling RF Heating of Active Implantable Medical Devices. Aug. 2007.

Balanis C. A. (1989), Advanced Engineering Electromagnetics, Canada.

Pauly JM, Nishimura DG. Macovski A. A k-space analysis of small-tip angle excitation. J Magn Reson 1989;81:43-56.

Macovski, A. (1996), Noise in MRI. Magn. Reson. Med., 36: 494-497. doi: 10.1002/mrm.1910360327.

Stang P. P., Pauly M. J., Scott G. C. Medusa: A Scalable MR Console Using USB. IEEE Transactions on Medical Imaging 2012. 31, 2: 370-379.

Lim J., Oh, S., Ahn D. A Power Divider with Adjustable Dividing Ratio. IEICE Trans. Electron. 2008. E91-C, 3: 389-391.

Memis, O. G., Eryaman, Y., Aytur, O. and Atalar, E. (2008), Miniaturized fiber-optic transmission system for MRI signals. Magn. Reson. Med., 59: 165-173. doi: 10.1002/mrm.21462.

Hoenninger, J.C., III; Crooks, L.E.; Arakawa, M.;, "A floating-point digital receiver for MRI," Biomedical Engineering, IEEE Transactions on , vol. 49, No. 7, pp. 689-693, Jul. 2002 doi: 10.1109/TBME.2002.1010852.

Dadok J, Sprecher RJ. Correlation NMR Spectroscopy. Journal of Magnetic Resonance 1974; 13:243-248.

Gupta RK, Ferretti JA, Becker ED. Rapid Scan Fourier Transform NMR Spectroscopy, 1974. Journal of Magnetic Resonance; 13:275-290.

Weiger M, Hennel F, Pruessmann KP. Sweep MRI with Algebraic Reconstruction 2010. Magnetic Resonance in Medicine; 64:1685-1695.

Nishimura, D., Principles of Magnetic Resonance Imaging, 1996.

Katscher, U., Lisinski, J. and Börnert, P. (2010), RF encoding using a multielement parallel transmit system. Magn. Reson. Med., 63: 1463-1470. doi: 10.1002/mrm.22439.

Sacolick, L. I., Wiesinger, F., Hancu, I., & Vogel, M. W. (2010). B1 Mapping by Bloch-Siegert Shift, 1322, 1315-1322. doi:10.1002/mrm.22357.

Idiyatullin et al., "Continuous SWIFT," Journal of Magnetic Resonance, vol. 20, pp. 26-31 (2012).

\* cited by examiner

MAGNETIC RESONANCE APPARATUS AND DATA ACQUISITION METHOD WITH DECOUPLING BETWEEN TRANSMIT AND RECEIVE COILS

RELATED APPLICATION

The present application claims the benefit of the filing date of provisional application No. 61/624,473, filed on Apr. 16, 2012.

BACKGROUND OF THE INVENTION

Field of the Invention

The invention is related to decoupling between transmit and receive coils using a transmit array in a magnetic resonance apparatus. It employs decoupling between RF transmit field and the magnetic field of receiver coil by reducing the total current induced in a receive coil by transmit coils. It can be used to achieve concurrent RF excitation and magnetic resonance imaging (MRI) signal reception so that magnetic resonance imaging based on the spin characteristics during excitation, and the concept of zero echo time can be realized. It can also be used in continuous wave MR spectroscopy, continuous wave MRI and MRI with ultra-short echo time (UTE), as well as real time field/impedance monitoring.

Description of the Prior Art

In MRI, both transmit and receive coils are tuned at the resonant frequency. However, coupling from transmit coil to the receive coil causes artifacts to occur in the image. In order to avoid those artifacts, decoupling between transmit and receive units is carried out by decoupling diodes in single or back to back convention where a DC voltage turns the diode(s) on and shifts the resonant frequency in order to avoid signal coupled in the receive coil during transmission. (Halise Irak, MS Thesis, Bilkent University, NOVEL RF COIL TECHNOLOGIES FOR MRI. June 2006) Another point of interest in isolation of transmit and receive units is that spins resonate at the excitation frequency and there is a few orders of magnitude difference in MRI signal and RF excitation signal voltage levels. Isolation between the MRI signal and RF signal is done by time-interleaved separation in most of the conventional MRI methods. In this classical approach however, magnetization characteristics during excitation are ignored. There are applications which use information about spin dynamics in presence of B1 excitation field. In continuous wave NMR, for example, concurrent transmission and reception is used and RF bridges are utilized for isolation between MRI signal and RF signal which increases RF power requirements resulting in excessive heating of the sample. (Schneider, E., Prost, R. W. and Glover, G. H. (1993), Pulsed magnetization transfer versus continuous wave irradiation for tissue contrast enhancement. J. Magn. Reson. Imaging, 3: 417-423. doi: 10.1002/jmri.1880030218] Other applications are spin-lock measurements (Ulmer, J. L., Mathews, V. P., Moran, P. R. (1996), Magnetization Transfer or Spin-Lock? An Investigation of Off-Resonance Saturation Pulse Imaging with Varying Frequency Offsets, Journal of Magnetic Resonance, 163: 318-324) and T1_rho weighted imaging (Borthakur, A., Sochor, M., Clark, C. M. (2008), T1ρ MRI of Alzheimer's disease, NeuroImage, 41: 1199-1205), where off-resonant RF is applied, and lock-in separation is used to extract the signal spectrally via demodulation. (Kotler, S., Akerman, N., Keselman, A., Ozeri R. (2011), Single-ion quantum lock-in amplifier, Nature, 473: 61-65. doi: 10. 1038/nature10010] For continuous field monitoring experiments (Sipila, P., Wachutka, G., Wiesinger, F. Coherent excitation scheme to operate pulsed NMR probes for real-time magnetic field monitoring, In: Proceedings, 17th Annual Meeting of ISMRM, 2009), data acquisition should not be interrupted, implying a need for concurrent detection of RF and MRI signal. One of the most significant applications is ultra-short T2 imaging. (Tyler D J, Robson M D, Henkelman R M, Young I R, Bydder G M. Magnetic resonance imaging with ultrashort TE (UTE) pulse sequences: technical considerations. J Magn Reson Imaging 2007; 25:279-289) For the samples having very short coherence time, acquisition with zero-echo time can be very useful to increase SNR. Former methods for concurrent transmission and reception include RF bridges, Lock-in separation, sideband excitation and separation by frequency modulation. Sideband excitation techniques uses off-resonant excitation on the order of a few megahertz and filtering in time domain provides necessary decoupling. (Brunner, D. O., Pavan, M., Dietrich, B., Heller, A., Pruessmann, K. P. Sideband Excitation for Concurrent RF Transmission and Reception, In: Proceedings, $19^{th}$ Annual Meeting of ISMRM, 2011) However, off resonant excitation increases RF power requirements to achieve the amount of flip angle possible with on resonant excitation. The spins of a sample will experience Bloch-Siegert shift during off-resonant excitation. Besides, hardware to implement sideband excitation is complex and expensive.

In the continuous shift method, decoupling sufficient to achieve the dynamic range is done by using a hybrid isolator for an orthogonally placed transmit receive coil pair, and the MRI signal is extracted from the frequency modulated RF signal using signal processing algorithms. (Idiyatullin, D., Suddarth, S., Corum, C., Adriany, G., Garwood, M. Continuous SWIFT, In: Proceedings, $19^{th}$ Annual Meeting of ISMRM, 2011) High dynamic range receiver electronics and extremely accurate tuning of isolator are basic hardware requirements of continuous swift method. Post processing of the received signal requires complex matrix operations with the input RF dependent parameters. Orthogonal transmit receive coil pairs are used also in continuous wave NMR. The use of transmit arrays is an alternative decoupling method or an additional procedure to provide extra decoupling which increases MRI signal level with respect to RF signal.

SUMMARY OF THE INVENTION

Magnetic field decoupling approach is used to reduce coupling between transmit and receive coils. Magnetic field decoupling can be achieved by cancelling the currents induced from the individual transmit coils either by forward and reverse polarized group of transmit coil pairs or by manipulating linearly polarized fields which is implemented by using a transmit array. The method introduced here makes on resonant RF excitation and concurrent reception of MRI signal possible. This approach is advantageous over other methods in the sense of time efficiency, power efficiency, SNR, flexibility of applied RF waveforms, and no need for complex post-processing algorithms to extract the MRI signal.

Decoupling between transmit and receive coils is achieved by using a transmit array system in a way that induced voltage from the transmit coils will cancel each other resulting in a significantly reduced coupling signal. The invention encompasses a method for decoupling of radio frequency (RF) coils implemented in a transmit array system with multiple transmit coil elements driven by RF current sources of different amplitude and phase. This method for decoupling provides isolation over 70 dB between Tx/Rx coils and it eliminates the need for detuning diodes for pulsed FT applications. Decoupling procedure is described and its performance is analyzed in terms of obtained isolation. As an alternative to other continuous wave MRI methods, this method reduces dynamic range requirements so that concurrent excitation and acquisition (CEA) sequences can be applied in standard MRI scanners. It is also shown that this method can be used to implement ultra-short echo time (UTE) imaging with a better time delay performance between transmit and receive modes. For CEA (concurrent excitation and acquisition), the acquired raw data is formulated as convolution of the sample's projection along the corresponding gradient direction and the input B1 field which is a chirp signal. First proof-of-concept 2D images are reconstructed from radial k-space data. UTE and CEA approaches are compared in terms of SNR and power requirements.

In accordance with the invention, concurrent excitation and acquisition (CEA) is implemented by the method described herein for decoupling of transmit and receive coils. This method provides an isolation up to 80 dB between B1 field and MR signal and it is based on cancellation of B1 induced currents on the receive coil with appropriate adjustment of amplitudes and phases of transmit coil array inputs. This method makes on resonant RF excitation and concurrent reception of MRI signal possible even with standard MRI scanners without a need for increase in the dynamic range of the receiver circuitry. The decoupling procedure is described and its performance is analyzed in terms of the obtained isolation for a CEA setup composed of two transmit and a receive coil. Acquired raw data is described in terms of B1 induced voltage, response of the spins, and noise induced by transmit signals and thermal sources. Reconstruction method is described under small-flip angle approximation. The MR signal is formulated as convolution of the sample's projection along the corresponding gradient direction and the input B1 field which is a chirp signal. First proof-of-concept 1D projections and 2D images are calculated for a set of experiments with UTE imaging and CEA for changing B1 frequency sweep rates. UTE and CEA approaches are compared in terms of SNR and power requirements. Different types of rubbers are used in the experiments as short T2 samples.

The isolation method is useful for applications that make use of information about spin dynamics in presence of B1 excitation field and applications of zero echo time imaging. Magnetic field decoupling is achieved by manipulating amplitudes and phases of the currents that drive the transmit coils. This approach is advantageous over other methods in the sense of providing more isolation, flexibility of applied RF waveforms, and reduced dynamic range requirements. Use of transmit arrays to cancel B1 induced currents stands for an alternative decoupling method or an additional procedure to provide extra decoupling which increases MRI signal level proportionally by reducing B1 induced potential.

BRIEF DESCRIPTION OF THE DRAWINGS

FIG. 8 schematically shows, in illustration (a), a pulse sequence timing diagram in accordance with the invention, and in illustration (b) shows the concurrent MR signal acquired using a 3T transmit array system with TR=1000 ms, resolution=512, and acquisition BW: 20,000 Hz, and in illustration (c) shows that the frequency of oscillation in the MR signal increases when the basic magnetic field is increased, and in illustration (d) shows that the input RF amplitude decreases when the slice selection gradient is turned on.

DESCRIPTION OF THE PREFERRED EMBODIMENTS

Decoupling

Figure 1:
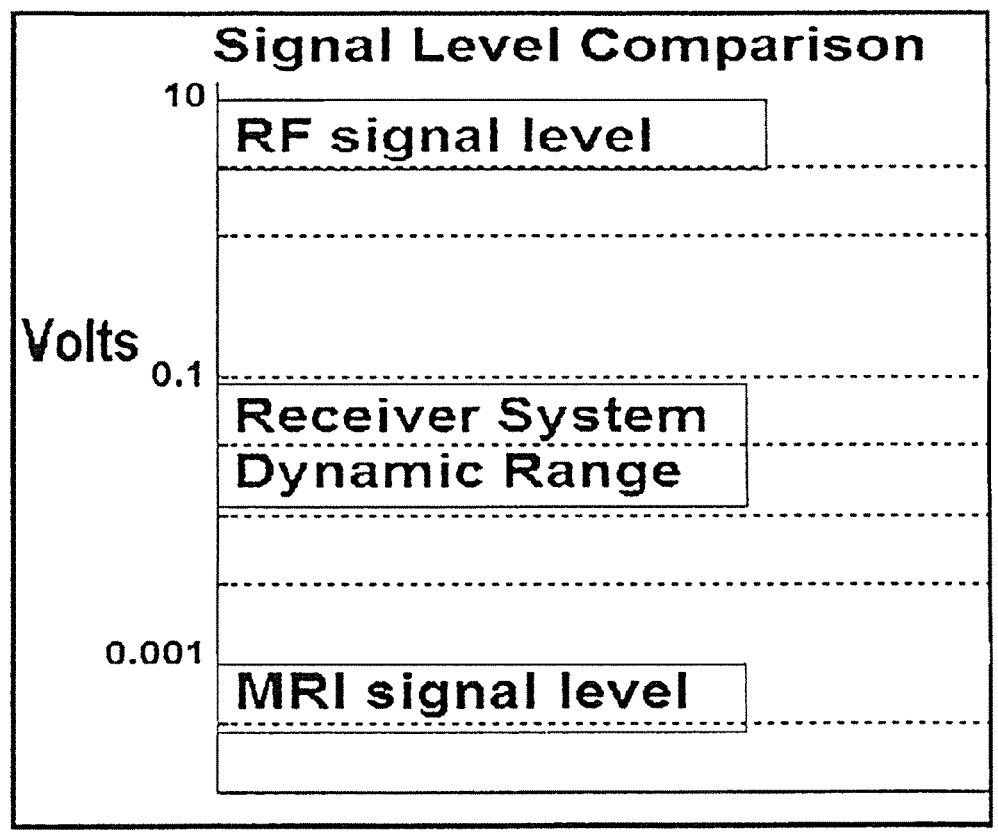
FIG. 1 shows signal voltage values for a typical case with excitation at Ernst angle and 3T static magnetic field, for a spherical phantom with a volume of 1000 cm3 excited with a loop coil encircling the sample.

Transmit RF pulse applied from a set of transmitting coils induce a current in the receive coil which is called as B1 induced current throughout the text. Using another set of transmit coils which are called as decoupling coils, driven by a certain phase, amplitude and frequency modulation characteristics such as to cancel B1 induced current generated by the set of transmitting coils. In this section, this idea of decoupling is explained and experimental results implemented in Siemens 3T Tim Trio Tx-Array system are shown.

In a concurrent excitation and reception experiment, acquired signal can be considered in four parts: B1 induced voltage, MR signal induced from change of total magnetization of the excited spins, transmit noise induced voltage, and the thermal noise. The signal is analyzed in terms of the weightings of its components which are B1 induced voltage, spin magnetization induced signal, and thermal noise. MRI signal is too weak compared to RF signal. Receive circuits are designed to detect MRI signal which is on the order of tens of micro volts and the receiver system dynamic range is much lower than the B1 induced voltage level which is on the order of volts. There is a difference between the B1 induced voltage and the magnetization induced signal level about 80 dB. This gives a hint about the required isolation between the receive and transmit coils. Initial requirement is to reduce B1 induced voltage down the receiver dynamic range. The more reduction is done, the more qualified the quantization of the magnetization induced signal becomes which is a significant factor for information obtained from the spins. Therefore, decoupling enough to reduce B1 induced voltage down to noise level is needed to acquire MRI signal directly during RF excitation with a reasonable signal to noise ratio. However, with the imperfections of the system in use, an isolation level that would make a direct detection possible could not be achieved. Therefore, it was necessary to insert a B1 induced voltage leakage in the formulation of the acquired raw data. Before reconstruction, background signal due to RF leakage is needed to be suppressed by appropriate subtraction methods.

Decoupling between transmit and receive coils can be implemented by combining multiple transmit coils with appropriate geometry, field magnitude and phase such that the total induced voltage in a receive coil(s) is zero. For an N-coil system of transmit array decoupling task can be expressed as $$V_+ = \sum_{n=0}^{N} I_n a_n = 0 \quad (1)$$

where $I_n$ is the current induced in a receiver coil due to $n^{th}$ transmit coil; $a_n$ is a complex coefficient for magnitude and phase adjustment for the $n^{th}$ transmit coil; and $V_+$ is the voltage seen in the receiver coil due to total induction currents from the transmit coil magnetic fields.

The problem can be extended to position dependent value of perpendicular component of the magnetic field strength Examining $$H_+(r_m) = \sum_{n=0}^{N} I_n b_n(r_m) = 0 \quad (2)$$

coils in a transmit array of ideally decoupled coil elements and solving equation-2 for $b_n$ results in a set of $r_m$ values that satisfies the equation. Voltages induced by individual coils can also be used to solve equation-1 for $a_n$, which is defined under homogenous magnetic field assumption.

Transmit array coils can be driven in a group of reverse/forward polarized fields combined such that the total induction current in a receive coil will be zero, thus no voltage will be measured at the output of the receive coil. Assuming ideally decoupled transmit coils, individual currents are to be measured and the subsequent coil's field will be adjusted in a way that it will cancel the current induced by the former coils.

Using a transmit coil array with a linearly polarized field distribution the magnetic field coupled into a receiver coil lying in the zero magnetic field plane can be reduced by a significant amount without a reduction in the magnetic field sensitivity of the transmit array.

Transmit coils having forward polarized fields can be combined to form a transmit array of coils that generates a linearly polarized field. Linearly polarized fields have reverse and forward polarized components which results in a sinusoidal variation in angular direction. This implies that linearly polarized fields have a zero E-field plane where the perpendicular component of Magnetic field is zero, as well. Therefore, if we place other coils lying in this zero magnetic field plane, no magnetic field will be coupled in those coils due to the magnetic field generated by the transmit coil array. The orientation of the transmit coil array can be changed to steer the zero magnetic field plane into an angular direction of interest. A transmit coil array of two or more elements which are fed by identical phase currents but sinusoidally varying magnitudes in angular direction can be utilized to steer the zero magnetic field plane. (Eryaman Y., Akin, B., Atalar, E. Reduction of Implant RF heating, MRM 2010)

The electric field distribution of a standard forward polarized coil is as follows.

$$E_z = \frac{A_{mn}\beta\rho}{2} e^{-j\phi}, E_\phi = 0, E_\rho = 0$$

The linearly polarized coil field expression is shown below. (Halise Irak, MS Thesis Bilkent University, Modeling RF Heating of Active Implantable Medical Devices. August 2007)

$$E_z = A_{mn}\beta\rho \cos \phi, E_\phi = 0, E_\rho = 0$$

It should be noted that the obtained transmit field distribution may not be perfectly linearly polarized but slightly elliptically polarized due to individual coil fields not being ideally homogenous in angular direction. In order to overcome this problem planar loop coils with small sizes should be used as transmit and receive coils placed at appropriate angular and distal positions. However, with small sized transmit and receive coils, communications between the cables become significant and such an effect would reduce the performance of the decoupling. In order to increase the decoupling with transmit coil array more than two transmit coils could be used, although two coils are sufficient to accomplish this task. It is also important to note that using different RF generator units may result in delays between transmit fields and decoupling fails at certain time intervals during transmission. In order to prevent this and other RF generator based mismatches between multiple transmit coils one RF generator can be used with a suitable power splitter by taking the geometrical decoupling into account. A phase adjustment unit must be added for at least one channel of the power splitter in order to implement two-port decoupling by zero magnetic field plane steering. Use of more than two coils in this procedure can increase the decoupling and provide a robustness to the transmit array field to achieve the decoupling task. It must be given care that individual coils of the transmit array to be decoupled from each other for the sake of robustness of the system.

Experimentally it is shown that if steer this plane is steered into the plane where the receiver coil lies, RF field decoupling is achieved up to 60 dB using two transmit coils and a receiver coil. The Siemens Tim Trio 3T 8-channel Transmit Array System was used in the experiments described herein.

Transmit array decoupling can be used together with geometric decoupling in order to further increase the amount of magnetic field decoupling by adjusting the transmit and receive coil planes orthogonal.

Figure 3:
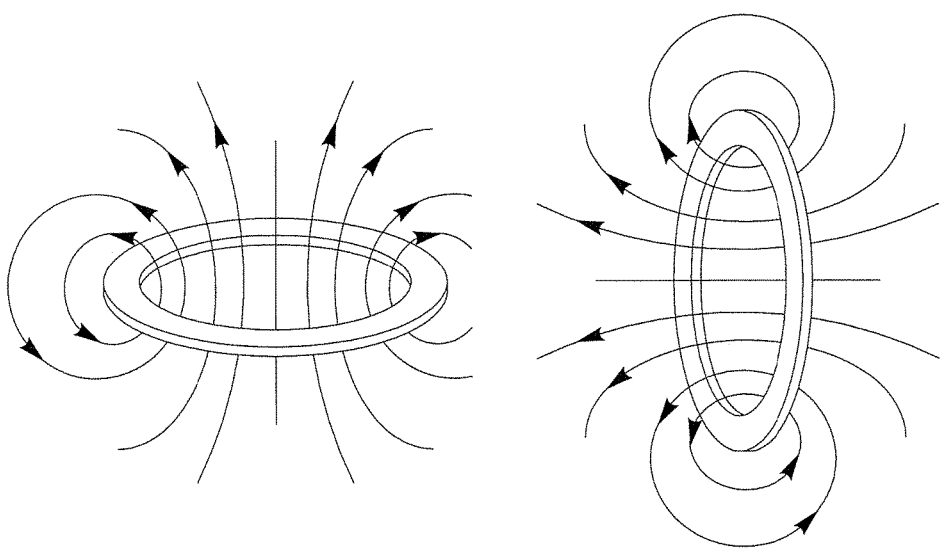
FIG. 3 illustrates rotation of the receiver coil at an angle that minimizes the magnetic field coupled from the receiver coil.

Geometrical decoupling is simply rotating the receiver coil with respect to one of the transmitter coils to reduce the RF signal coupled on the receiver (FIG. 3). The magnetic field coupled from one of the transmit coils to the receiver coil with the assumption of small sample load can be expressed as follows. (Balanis C. A. (1989), Advanced Engineering Electromagnetics, Canada) By setting the coil planes orthogonal the magnetic flux in the receiver coil would be zero in ideal case of planar coils with homogenous field distributions.

$$\left[ \frac{-j\beta_{z0}B_{10}}{\rho\beta_{\rho0}^2} J_1(\beta_{\rho0}\rho) - \frac{\sigma' A_{10}}{\beta_{\rho0}} J_1'(\beta_{\rho0}\rho) \right] e^{j\phi} e^{-j\beta_{z0}z}$$

A geometrical decoupling setup was constructed with a frame in which a phantom was taped to a plate with a reception coil, such that the reception surrounded the phantom. The plate was mounted on an axle proceeding through the frame, so that the axle, and thus the phantom-plate-reception coil assembly, could be rotated so as to assume selected rotational positions. The transmit coil was one of the two channels of the Siemens Tim Trio 3T body coil. The rotation setup allowed flexibility in this system such that different transmit coils and receiver coils can be arranged at an angle of minimum decoupling without much inconvenience. It was experimentally shown that up to 35 dB decoupling can be achieved by this method.

By setting the coil planes orthogonal to each other the magnetic flux in the receiver coil would be zero in ideal case of planar coils with homogenous field distributions. In practice, field polarizations are not ideally linear but slightly elliptical which puts a limitation on the maximum achievable decoupling by geometrical means. The remaining B1 induced current due to the orthogonal transmit coil cancelled by applying a weaker B1 from the second transmit coil with an amplitude corresponding to the reduction achieved by geometrical adjustment and appropriate phase value, as shown in FIG. 9.

Figure 9:
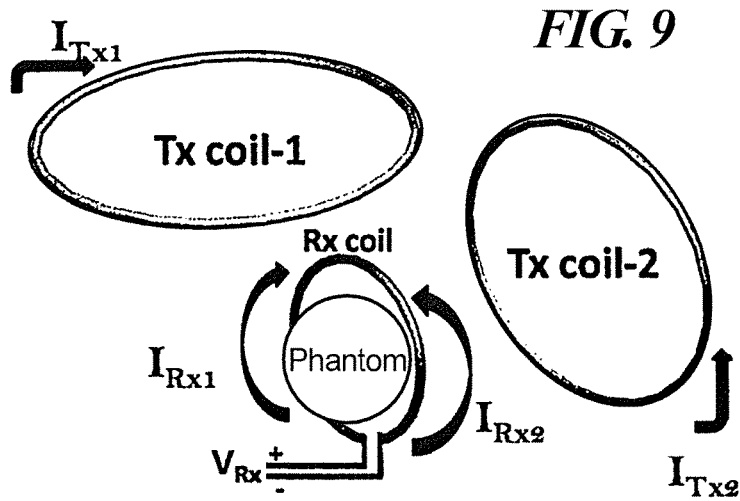
FIG. 9 illustrate a two-port decoupling process in accordance with the present invention.

FIG. 9 is a visualization of two-port decoupling process. First, Tx coil–1 and receive coil placed orthogonally which reduces the B1 induced current on the receive coil as well as the transmit noise coupled current. Tx coil 1 is driven by a current $I_{Tx1}$ inducing $I_{Rx1}$ on the receive coil. The amplitude and phase of Tx coil–2 are adjusted such that $I_{Rx2}$ cancels IRx1 out which reduces the total B1 induced voltage $V_{Rx}$ by a significant amount. As the $I_{Tx1}$ is greater than $I_{Tx2}$ by the amount of the geometrical decoupling, the spins of the phantom load of the receive coil is excited mostly due to magnetic field produced by Tx coil–1.

Since the decoupling operation does not change the magnetic field sensitivity of the transmit coil array, the spins of the sample are still get excited due to transmit RF field resulting in an MRI signal which could be detected by the receiver coil during RF excitation.

The decoupling procedure based on linearly polarized fields and additional geometrical decoupling is as follows. First using the rotation setup and transmitting RF power using one of the transmit channels a certain amount of geometrical decoupling is achieved by rotating the receiver coil in angular direction while checking the voltage induced with an oscilloscope. An attenuator equivalent to the decoupling amount is connected to another transmit channel. These two transmit coils are arranged to obtain a linearly polarized field while checking the voltage induced on the receiver coil, phase values of the transmit channels that would achieve linear polarization is calculated and applied. Once the voltage induced on the receiver is reduced down the noise level of oscilloscope (1 $mV_{pp}$) the receiver loop is connected to ADC via the ultra-low noise preamplifier or optical data transmission unit. Further increasing the number of transmit coils would improve the success of the decoupling. Sequences for imaging can be applied then.

The current system is to be optimized and modified to make its use convenient in research and for clinical purposes. For in vitro measurements and spectroscopy studies, a motor controlled rotation mechanism receiving magnetic feedback can be used. However, for clinical use and in vivo measurements, it is not feasible to rotate patients and therefore the system design must be modified appropriately. For that purpose, transmit coils can be rotated around the patient. More feasible transmit coil design would be using a transmit array of N channels where N small coils are driven by embedded RF generator units which can be FPGA controlled placed close to the transmit coils. Geometrical decoupling could be achieved by selection of appropriate coil sets and multipart decoupling can easily be achieved using the remaining elements of the transmit coil array. This design has advantages over others for not having a moving part inside the scanner. Besides, small transmit coils upgrades linearity of the transmit field and multiple port decoupling increases amount of decoupling achieved by use of only two ports.

Concurrent RF Transmission and MRI Signal Reception.

One of the main problems encountered in implementation of concurrent transmission and reception is that MRI signal is too weak compared to RF signal. In addition, receivers are designed to detect MRI signal which is less than millivolts, and the receiver system dynamic range is much lower than the RF signal voltage level. Representative plots for comparison of corresponding signal voltage levels are shown in FIG. 1.

The MRI signal voltage level is lower than the RF signal by a few orders of magnitude. Therefore, decoupling about 80 dB between MRI signal and the RF signal is needed to detect MRI signal directly during RF excitation. The method according to the invention achieves the required magnetic field decoupling using a transmit array system. In this method, magnetic field coupled into the receiver coil due to the linearly polarized transmit field is reduced by adjusting the zero magnetic field plane to be coplanar with the receiver coil plane. Since this operation does not change the magnetic field sensitivity of the transmit coil array, the spins of the sample are still get excited due to transmit RF field resulting in an MRI signal which could be detected by the receiver coil during RF excitation.

Figure 2:
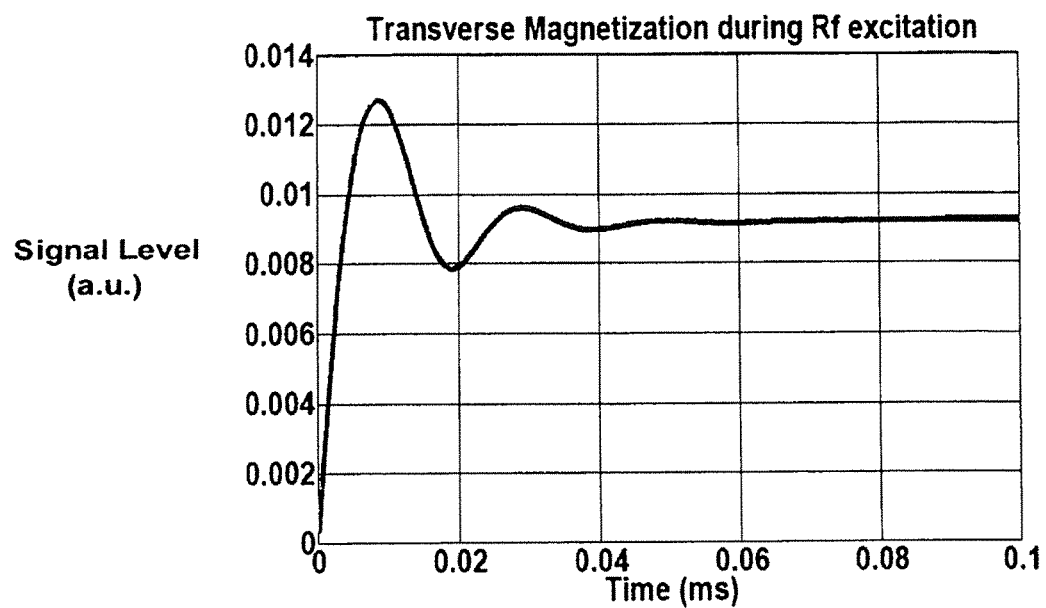
FIG. 2 shows transverse magnetization during rectangular B1 excitation calculated from Bloch equations under small flip angle assumption for a sample with T2=1 ms and no gradients applied.

The expected signal is simulated in MATLAB as the magnitude of the transversal magnetization vector during excitation. (Roberts J. D. The Bloch Equations. Concepts in Magnetic Resonance 1991; 2: 27-45) Bloch equations are solved numerically using rotation matrices and the transverse magnetization is calculated under the small-tip angle approximation (Pauly J M, Nishimura D G, Macovski A. A k-space analysis of small-tip angle excitation. J Magn Reson 1989; 81:43-56) as shown in FIG. 2.

As can be seen from the simulation results, it was expected to acquire a decaying oscillation with a frequency depending on B1 field magnitude and relaxation parameters of the sample. Time constant of the decay is determined by the B1 waveform as well as the T2 value of the sample. Peak amplitude of the decaying oscillation depends on the B1 field magnitude as well. In addition, the magnetic field strength will determine the received signal magnitude. The simulations proceeded ignoring noise sources and any other influences of experimental complications such as imperfections in decoupling.

Improving the decoupling, signal level in concurrent excitation and reception experiments will be increased significantly. The system introduced in this work stands for a promising system for implementation of NMR applications such as ultra-short T2 imaging, continuous wave MRI and a powerful alternative for concurrent excitation and reception methods such as sideband excitation and continuous swift.

In the MRI system described herein, the isolation between transmit RF field and the MRI signal is achieved by magnetic field decoupling. Therefore, different from other methods, in this method both RF excitation and signal acquisition can be set on resonant. This method provides wide range flexibility for the applied RF field. As long as transmit array elements are fed by the same amplitude modulation characteristics the magnetic field decoupling could be achieved by the method presented in this work. The same argument is valid for the frequency modulation if it is used.

Once concurrent excitation reception is achieved with a wide range flexibility of applied RF field, many applications become available.

One application is continuous wave MRI, in which the RF is applied continuously instead of a pulsed MR approach. In classical continuous wave MRI approach, a sample is exposed to continuous RF irradiation and the absorption signal is measured by sweeping the applied RF field around resonant frequency. Then, an acoustic modulation is applied and lock-in measurements follow. However, in concurrent excitation reception case, on resonant RF is applied permanently and the data is acquired whenever required during the continuous excitation. Use of continuous excitation reduces peak power requirements of the applied RF field because the duration of RF is extended. Since the SAR is proportional to the square of the peak B1 voltage, SAR will be less in continuous wave approach compared to the pulsed NMR approach.

Time interleaved approach in MRI results in limitations in echo time due to gradient and RF coil switching times, coil ring down times and acquisition bandwidth. The idea of concurrent excitation and reception overcomes those problems due to its intrinsic property of zero echo time. Concurrent excitation and reception using magnetic field decoupling with transmit array enables the detection of on resonant MRI signal during on resonant excitation. Therefore, there will be no need for RF coils to be turned off but the receiver unit can acquire signal at any time point and acquisition bandwidth is not limited. In addition, concurrent excitation and reception provides us with the knowledge of spin properties during excitation. Since excitation lasts much shorter than the relaxation, imaging using spin parameters identifying excitation characteristics will take shorter in time.

The signal to noise ratio (SNR) is proportional to square root of the acquisition duty cycle. (Macovski, A. (1996), Noise in MRI. Magn. Reson. Med., 36: 494-497. doi: 10.1002/mrm.1910360327) Using concurrent excitation reception approach in MRI signal can be acquired during excitation continuously without a need for interrupting acquisition channels. Availability of acquisition of MRI signal for 100% of the experiment stands for a promising enhancement of SNR compared to time interleaved excitation and acquisition schemes.

Transmit field noise disrupts the linearity of the polarization of the obtained RF field. Therefore, RF generator unit should have low noise characteristics. Especially the transistors in high voltage power amplifiers have high noise figure which results in the input noise to be elevated and delivered to the transmit coils. Therefore, in the MRI system described in this work, use of low noise elements is a key point for successful implementation of magnetic field decoupling. It is not possible to decouple RF noise emitted from independent noise sources.

In order to avoid their extensive noise contribution power amplifiers can be extracted from the setup and FPGA controlled pulse width modulation (PWM) based RF generators can be used instead if phase noise could be handled within reasonable limits. FPGA controls the switching transistor and the pulse width for switch-on state determines the amplitude of the RF signal transmitted while the delay of FPGA pulse train determines the phase of the RF output. Note that it is possible to use a sinusoidal voltage source instead of a constant DC voltage for the sake of efficiency.

Replacing high voltage power amplifiers, which require massive hardware covering large space with extra equipment such as chilling units, with small and simple structures such as FPGA based PWM sources the possibility of placing the RF generator units inside the scanner room near the transmit coils. Such a modification in the RF transmit system is advantageous over the standard system as it overcomes the cable based problems. Besides, the need for extra spaces allocated for massive large-cased elements disappear.

For a standard system with a transmit noise level high enough to disturb magnetic field decoupling the use of geometric decoupling helps the noise as well as the RF signal coupled in the receiver coil to be reduced although the excitation of sample will remain noisy anyway.

Other than thermal noise, there may be some other interference causing distortions in the transmitted RF signal such as voltage fluctuations, modulator based frequency shifts, phase noises based on oscillator infidelities . . . etc. Such distortions and noise are hard to deal with when they are emitted from independent sources. Use of a single RF generator unit with a power splitter is a useful approach that cancels RF generator unit based abnormalities. For example, field of two transmit coils fed up by one RF generator unit with a power splitter will cancel the abnormalities as well as magnetic fields coupled in the receiver coil because identical abnormalities are delivered to both coils.

An RF generator unit design based on digital synthesizer controlled by FPGA can be used in the transmit array to achieve magnetic decoupling task. Such a design provides flexibility in many applications and multiple channel transmission tasks can be controlled on an ordinary computer though a fast data connection. (Stang P. P., Pauly M. J., Scott G. C. Medusa: A Scalable MR Console Using USB. IEEE TRANSACTIONS ON MEDICAL IMAGING 2012. 31, 2: 370-379) For a better performance in magnetic field decoupling and concurrent excitation reception tasks RF signal voltage must be high enough to avoid the use of power amplifiers. Low noise power amplifiers may also be developed in case of need for higher transmit peak voltage values.

RF power transmission through cables for long distances cause RF power loss and unwanted signals to be coupled in the cables despite shielding, Faraday cages or BALUNs. Coupling between the cables will always be problematic and especially coupling between receive and transmit cables reduce the performance of magnetic field decoupling. Transmit coils can be driven by compact RF generators which are placed in the scanner room right next to them instead of carrying RF power from an outside unit for long distances through coaxial cables. One RF generator can feed a group of transmit coils or individual generators can be connected to each transmit coil.

In order to avoid noise and effects of high static magnetic field, these generator units can be composed of FPGA controlled PWM based RF sources replacing high voltage power amplifiers with massive chilling units.

A transmit array of N elements with increased linearity provides better decoupling performance. Geometric decoupling can also be implemented here by choosing the most appropriate coil array group instead of placing moving or rotating setups in the scanner. In addition, increasing the number of transmit array elements participating in decoupling task would increase the amount of decoupling achieved. In addition, SAR reduction methods can be applied if necessary.

As stated previously, use of a single RF generator source feeding a few transmit coils has advantages since this design avoids the problems based on the use of different RF generators. There are plenty of possible ways of splitting power of a single RF source into multiple channels. The design can be generalized by a power splitter unit of three ports with a power ratio of R which indicates that power is divided into % R and 1–% R for two output ports. Key factors for design are isolation of output ports and appropriate impedance matching.

Once the power is divided over the required ratio, a phase shifter is to be added to at least one of two output ports. There are many ways to implement a phase shifting, but for the purpose herein, it is best to design a phase shifter with variable adjustment of high resolution. Adjustable power division ratio can also be implemented for flexibility purposes. One way of implementing adjustable unequal Wilkinson power divider uses defectable ground structure with varactor diodes. (Lim J., Oh, S., Ahn D. A Power Divider with Adjustable Dividing Ratio. IEICE TRANS. ELECTRON. 2008. E91-C, 3: 389-391)

The use of single RF generator unit with a phase adjusting power splitter can be implemented for all types of RF generator units. In case of FPGA controlled RF sources, digital phase shifters can also be used for the same purpose. The zero magnetic field plane of the linearly polarized field can be steered by any angle by adjusting the phase and amplitudes of the transmit coils properly.

If geometric decoupling is applied as well, splitter ratio must be set up to compensate the difference between the amounts coupled from geometrically decoupled and non-decoupled transmit coils. For example, in a two transmit coil system, if one of the coils is decoupled 30 dB by geometrical means, than the power splitter ratio should be arranged as 99.9% to 0.1% so that steering zero magnetic field can be achieved by phase adjustment tool.

The signal induced from the nuclear spins due to time derivative of total magnetization is amplified by a preamplifier circuit with a gain more than 25 dB and noise figure less than 1 dB. The increased signal is than modulated and the remaining baseband signal is delivered to the ADC that digitizes the signal, and the raw data is sent to image reconstruction system to form an image out of the MRI signal.

In the data reception pathway unbalanced currents are formed unless the data transmission path has perfect symmetry. These unbalanced currents become more effective if there is an RF signal coupled in the receiver. In order to avoid unbalanced currents formed in the shield BALUN circuits are strongly recommended which suppress unbalanced currents by a significant amount.

The use of coaxial cables in signal transmission is common in most MRI applications. However, problems are associated with using coaxial cables, such as heating and extra size of interconnections in case of a need for multiple elements in transmission or reception as well as the coupling among the cables. In order to resolve these problems, signal transmission can be carried out by a fiber optic line system with preamplifiers, laser diode, and matching circuitry. (Memis, O. G., Eryaman, Y., Aytur, O. and Atalar, E. (2008), Miniaturized fiber-optic transmission system for MRI signals. Magn. Reson. Med., 59: 165-173. doi: 10.1002/mrm.21462) For the MRI system described in this work, optical signal transmission is especially useful to avoid coupling of circularly polarized RF field components in the cables on the receiver side would reduce the performance of the decoupling. Moreover, unbalanced currents would be reduced which is a problem of coaxial lines.

Another point of interest in the design of such a receiver unit is the dynamic ranges of the components. If there is a need to increase the RF signal to a level that decoupling is not sufficient to suppress the RF signal coupled to receiver coil into an acceptable level, the preamplifier design should be improved to increase the linear range. ADC has also a dynamic range and it can be increased in a few ways. One possible way of improving dynamic range of ADC uses high sampling rates. There are ADCs commercially available with 16 bit resolution sampling at 100 Megasamples per second with increased dynamic range and signal to noise level. Use of high sampling rate ADCs allows digitization before demodulation. Therefore, demodulation can be implemented in digital domain, which is preferable against analog demodulation because quadrature analog receivers have problems with channel matching, dc offset and analog-to-digital linearity. (Hoenninger, J. C., III; Crooks, L. E.; Arakawa, M.; "A floating-point digital receiver for MRI," Biomedical Engineering, IEEE Transactions on, vol. 49, no. 7, pp. 689-693, July 2002 doi: 10.1109/TBME.2002.1010852) Such a modification in signal reception unit can be applied to optical transmission systems as well.

The expected signal for a concurrent excitation and acquisition experiment with rectangular RF is simulated in MATLAB as the magnitude of the transversal magnetization vector during excitation. Bloch equations are solved numerically using rotation matrices and the transverse magnetization is calculated under the small-tip angle approximation as shown in FIG. 2.

FIG. 2 shows the traverse magnetization during rectangular B1 excitation calculated from Bloch equations under small tip angle assumption for a sample with T2=1 ms and no gradients are applied.

As can be seen from the simulation results, a decaying oscillation with a frequency depending on B1 field magnitude and relaxation parameters of the sample is acquired. Time constant of the decay is determined by the B1 waveform as well as the T2 value of the sample. Peak amplitude of the decaying oscillation depends on the B1 field magnitude as well. In addition, the magnetic field strength will determine the received signal magnitude. Note that the simulations are proceeded ignoring noise sources and any other influences of experimental complications such as imperfections in decoupling.

Acquired raw data in a CEA experiment can be modeled as additive combination of MR signal and a frequency dependent leakage component due to insufficient decoupling.

$$s_r(t) = s(t) + A(w) * e^{i\phi}$$

A(w) is approximated for hybrid coupler systems used in classical CW-NMR systems with lock-in detection by:

$$A(w) = \frac{R_{coil}}{1 + \Delta w^2 \tau^2} + i \frac{R_{coil} \Delta w \tau}{1 + \Delta w^2 \tau^2}$$

It reported in Idiyatullin, 2012, a second order polynomial fitting is sufficient to approximate A(w) instead of solving the equation analytically. Another method is to measure the received signal when receive coil is unloaded. In the experiments reported herein, two subsequent data sets were acquired, one with a gradient of low amplitude for spatial encoding purposes and the other with very high amplitude approximating the case that the spin magnetizations are completely spoiled. Then, the difference of two cases is considered to be the MR signal. Note that the amplitude of the B1 induced leakage signal may differ for subsequent measurements due to instabilities occurring in Tx-Array control unit. Therefore, the DC levels of subsequent measurements are equalized before subtraction.

A special but common case about the decoupling is the time varying pulses. The system response to the time varying frequency must be utilized in order to determine the appropriate decoupling signal. For example if the system has a frequency response as shown in FIG. 9b, the decoupling pulse can be calculated with respect to the original transmit pulse and the system's frequency response as shown in graph d of FIG. 9. Such an adjustment would increase the decoupling performance.

Figure 10:
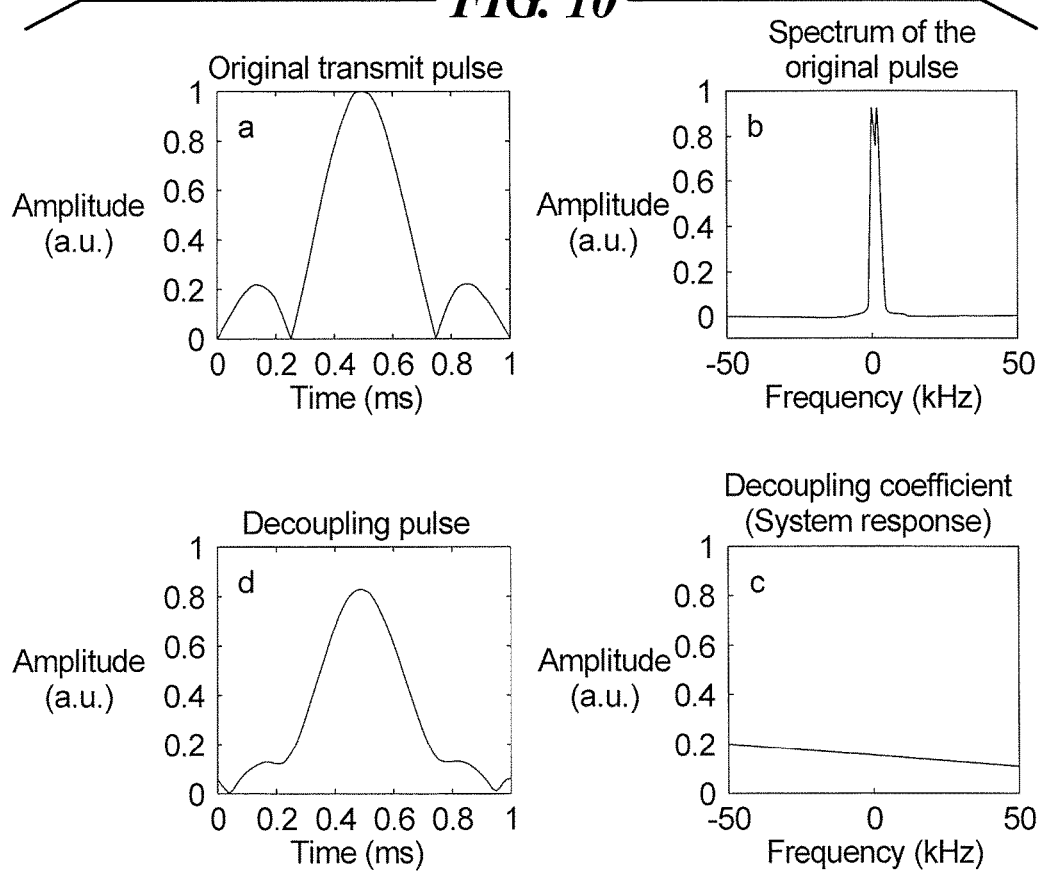
FIG. 10 shows the transmit sine pulse with a single side lobe in graph a thereof, the spectrum of the sinc pulse in graph b thereof, the frequency response of the decoupling system in the 1024 Hz range in graph c thereof, and the required transmit pulse for decoupling, in graph d thereof.

FIG. 10 also shows the transmit sinc pulse with a single side lobe in graph a, the spectrum of the sinc pulse in graph b, and the frequency response of the decoupling system in 1024 Hz range in graph c.

In previous implementations of CW-NMR, signal reconstruction is based on a deconvolution procedure. The FID is approximated as the impulse response of the spins as a linear system to an input B1 waveform. (Dadok J, Sprecher R J. Correlation NMR Spectroscopy. Journal of Magnetic Resonance 1974; 13:243-248.) The formulation is as follows (Gupta R K, Ferretti J A, Becker E D. Rapid Scan Fourier Transform NMR Spectroscopy, 1974. Journal of Magnetic Resonance; 13:275-290.):

For wt=bt, the Bloch equation for transverse magnetization component is $$M_{xy}(t) = -\left(\frac{1}{T_2} + i(bt - w_o)\right) M_{xy}(t) - i\gamma B_1 M_o$$

-continued $$b \frac{dM_{xy}(w_t/b)}{dw_t} = -\left(\frac{1}{T_2} + i(bt - w_o)\right) M_{xy}(w_t/b) - i\gamma B_1 M_o$$

Applying a Fourier transformation to this equation we get $$\widetilde{M_{xy}}(f) = \frac{\pi}{2} \int_{-\infty}^{\infty} M_{xy}(w_t/b) e^{iw_t f} dw_t$$

Multiplying both sides of the Bloch equation by and integrating from and we get $$\widetilde{M_{xy}}(f) = cM_o e^{-\frac{f}{T_2} + iw_o f} e^{ibf^2/2}$$

$$\widetilde{M_{xy}}(f) = h(f) e^{ibf^2/2}$$

Where $\widetilde{M_{xy}}(f)$ is the inverse Fourier transform of $M_{xy}(t)$ and for a single spin response $$h(f) = M_o e^{-\frac{T}{T_2} + iw_o T}.$$

Although this formulation is utilized in most of the cw-NMR studies, the problem with this formulation is the assumption of time invariance of the spin response which is valid only for $bt >> 1/T_2$. Besides, the analytical formulation is done only for chirp pulses. Therefore, we aim to obtain a formula which is valid for all the range of sweep rates and relaxation times, as well as it should be applicable to FM pulses other than chirp modulation. Since it does not seem possible to obtain an analytical formulation of such general use, we will seek a numerical procedure similar to that is done for SWIFT reconstruction by algebraic means (Weiger M, Hennel F, Pruessmann K P. Sweep MRI with Algebraic Reconstruction 2010. Magnetic Resonance in Medicine; 64:1685-1695.)

In our formulation we calculated the signal response to an excitation at time s accumulating at time t is considered for a time interval [τ-/2,τ/2]. Acquired MR signal is the space integral of the transverse magnetization which is expressed for small flip angle ignoring relaxation coefficients by (Nishimura, D., Principles of Magnetic Resonance Imaging, 1996.):

$$s(t) = \int_{-\infty}^{\infty} M_r(x,t) dx = i \int_{-\infty}^{\infty} M(x) \left[ \int_{-\tau/2}^{t} e^{-iw(x)(t-s)} w_1(s) ds \right] dx$$

We can solve for a chirp B1 pulse with amplitude $B_{10}$, τ duration and frequency sweep range fs. Simplifying the expression and applying a change of variables we obtain the below expression for the MR signal.

$$w_1(t) = \gamma B_{10} e^{-i2\pi f_s t^2/\tau}$$

$$w(x) = \gamma G x$$

$$s(t) = i\gamma B_{10} \sqrt{\tau/f_s} \int_{-\infty}^{\infty} M(x) e^{-i\gamma G x t} e^{i2\pi k^2} \left[ \int_{(-\sqrt{\tau f_s} - k)}^{(t\sqrt{f_s/\tau} - k)} e^{i2\pi v^2} dv \right] dx$$

where $$k = \frac{\gamma \cdot Gx}{2\sqrt{f_s/\tau}}$$

The definite integral part of this equation between the brackets results in complex Fresnel integrals which could be approximated as unit step function for the case that the pulse duration $u(t-k/\sqrt{f_s/\tau})$ ch greater than $T_2^*$:

We can use the fact that unit step function $u(t)$ is zero for $t<0$:

$$s(t) = i\gamma B_{10} \sqrt{\tau/f_s} \int_{-\infty}^{2tf_s/\gamma G\tau} M(x) \cdot e^{-i\gamma Gxt} e^{i2\pi x^2} dx$$

Using another change of variables to get rid of exponential term:

$$s(t) = i\gamma B_{10} \sqrt{\tau/f_s} \, e^{-i2\pi t^2 f_s/\tau} \int_{-\infty}^{2tf_s/\gamma G\tau} M(x) e^{i2\pi(k-t\sqrt{f_s/\tau})^2} dx$$

At this point, we can reconstruct $M(x)$ numerically by evaluating the integral at every x value within the field of view which results in a matrix of $s(t)$ evaluated at discrete x points. $M(x)$ is obtained from the following equation:

$$S = R*M \rightarrow M = R^{-1}S$$

where the matrix R contains the elements of the $s(t)$ expression.

Image Reconstruction

The transverse component of magnetization can be formulated using small-flip angle approximation and ignoring relaxation, as follows. (Nishimura D. Principles of Magnetic Resonance Imaging. 1996)

$$M_{xy} = iM_0 e^{-iw(z)t} \int_0^t \gamma B_1(\tau) e^{iw(z)\tau} d\tau$$

For simplicity image reconstruction formulation is restricted to one dimensional with constant gradient case. The resulting baseband signal in presence of a constant gradient along z direction is the integral of the transverse magnetization along z.

$$s(t) = i\gamma \int_0^t \left[ \int_z M_0(z) e^{-i2\pi \gamma G_z(t-\tau)} dz \right] B_1(\tau) d\tau \quad (3)$$

The expression in the middle represents a Fourier transformation.

$$s(t) = i\gamma \int_0^t [\{FM_0(k_z)\}] B_1(\tau) d\tau$$

where $k_z = \gamma G_z(t-\tau)$, and '$FM_0$' represents Fourier transform of '$M_0$'.

The discrete form of this equation in sample base results in a matrix multiplication task.

where $s = [s(n\Delta t)]$ is an N×1 vector, $$B = \begin{bmatrix} \ddots & 0\cdots & 0 \\ \vdots & B_1((n-m)\Delta t) & \vdots \\ \cdots & \cdots & \ddots \end{bmatrix}$$

is an M×N matrix, and $M = [\{FM_0(\gamma G_z m\Delta t)\}]$ is an M×1 vector.

The solution of this matrix equation for M will be inverse Fourier transformed to obtain information about the object.

Another formulation follows from the fact that equation (4) can be interpreted as a convolution in time. Taking the Fourier transform of equation (4) directly results in the object information M0.

$$F\{s(n\Delta t)\} = M_0 F\{B_1((n-m)\Delta t)\} \quad (5)$$

Equation (5) can be used to form a matrix equation such as equation (4) and solved to obtain information about the sample object.

The existence of a multi-channel transmit array unit in the current system brings up the use of non-linear RF field for encoding purposes. Especially a transmit array system with a number of spatially distributed transmit coils is very useful for RF encoding which is reported to be an alternative to conventional signal encoding techniques using gradient fields. Excluding gradient fields helps avoiding gradient field based problems such as acoustic noise and peripheral nerve stimulation. (Katscher, U., Lisinski, J. and Bornert, P. (2010), RF encoding using a multielement parallel transmit system. Magn. Reson. Med., 63: 1463-1470. doi: 10.1002/mrm.22439) The MRI system described in this work can be used to generate spatial encoding RF field distribution.

Material and Methods

In a further setup, one transmit coil is driven with RF input power of 8 mW and the other one with 0.4 mW. After the decoupling is achieved, B1 induced voltage is reduced to 0.5 mV including the preamplifier gain of 35 dB with 0.8 dB noise figure. Rectangular receive loop coil is loaded with a plastic bottle of 7 cm diameter and 15 cm height full of tap water solution of 1 gr/l saline and 1 gr/l $CuSO_4$ ($\epsilon r = 60$, $\sigma = 0.2$ S/m). For the small circular loop coil a simpler glass rotation setup is used instead of the plastic one in order to prevent background signals formed by ultra-short T2 substances. Liquid samples used for loading of small loop coil are put in a cylindrical glass cup with 6 cm diameter and 5 cm height. Tap water and a 1 cm diameter syringe with olive oil inside in the middle of the glass cup, and 50% ethyl alcohol-water solution are the liquid samples. A solid sample composed of three rectangular prism shaped rubbers of similar dimensions (0.3×1.5×3 cm) placed in parallel with 1 cm distance in between is also used in the experiments. Chirp pulses with frequency sweep ranges and pulse durations of 1) fs=2 kHz, =40 ms, $G_y$=4 mT/m
2) fs=20 kHz, =8 ms, $G_x$=4 mT/m are calculated in MATLAB and inserted in pulse sequence executive files using pulse programming environment of Siemens Medical Systems (known as IDEA). Zero gradient case and gradients along different directions are also programmed using IDEA as shown in the pulse sequence diagram in FIG. 10.

Figure 11:
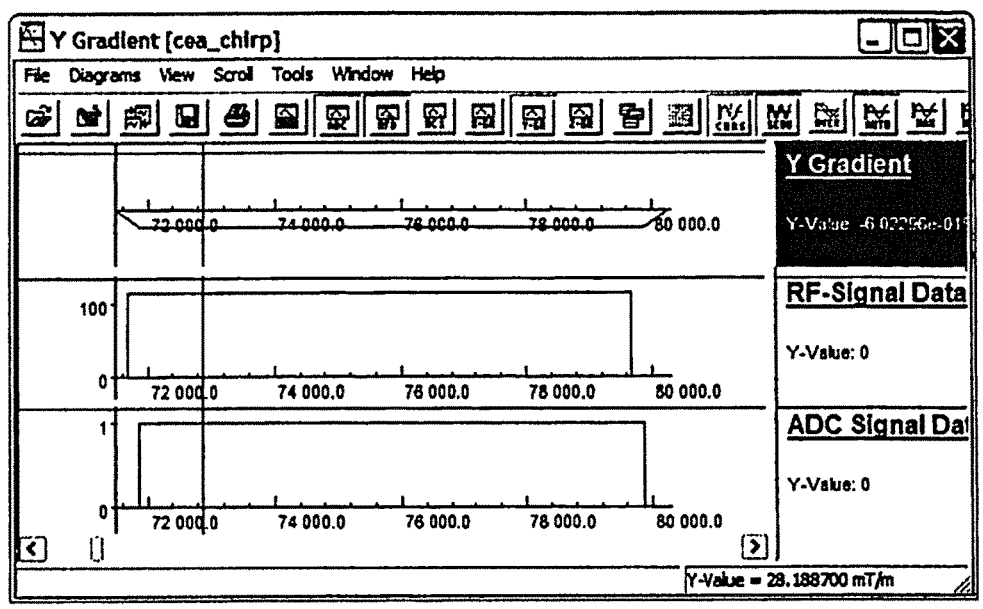
FIG. 11 shows an exemplary pulse sequence diagram for excitation, acquisition and encoding suitable for use in accordance with the present invention.

FIG. 11 shows an exemplary pulse sequence diagram representing excitation, acquisition and encoding timings and magnitudes for a single TR interval. Time axis is in μsec, magnitudes are in mT/m for gradient waveforms, arbitrary units for RF signal data. 32 mT/m gradients are applied to decrease the background signal from the spins and to acquire the remaining B1 induced signal alone which is to be subtracted from the raw data for low-gradient cases. Gradients along with the sweep range determine the FOV and resolution. Changing the orientation of the gradients means acquiring projections along various directions.

Raw data is read and saved with a MATLAB program and average of 10 acquisitions for each case is assigned to vector variables. Reconstruction formula is inserted in a MATLAB function and 1-D projections are calculated along each gradient direction as well as the spectrum of the sample. $|B1^+|$ value is also calculated using Bloch-Siegert shift method (Sacolick, L. I., Wiesinger, F., Hancu, I., & Vogel, M. W. (2010). B1 Mapping by Bloch-Siegert Shift, 1322, 1315-1322. doi:10.1002/mrm.22357), for reference input voltage of 20V.

A further experimental setup was used with two transmit and a receive loop coil. A rubber phantom was placed on the receive coil.

For the rubber phantom experiments transmit coils are two channels of a 30 cm diameter 8 channel birdcage coil with rectangular coil elements of 7×20 cm each. Receive coil is 9 cm diameter surface coil built on an epoxy plate, tuned at 123.25 MHz with Q=240. We drive $Tx_1$ from a Tx-array modulator output via an ULNA, while Tx2 is driven directly from the modulator output without amplification. Orthogonal placement of $Tx_1$ and Rx is significant to reduce transmit noise coupled on the receive coil in CEA applications. Decoupling is done by adjusting individual amplitudes and relative phases of $Tx_1$ and $Tx_2$ so that individual B1 induced currents on Rx coil is cancelled.

Figure 12:
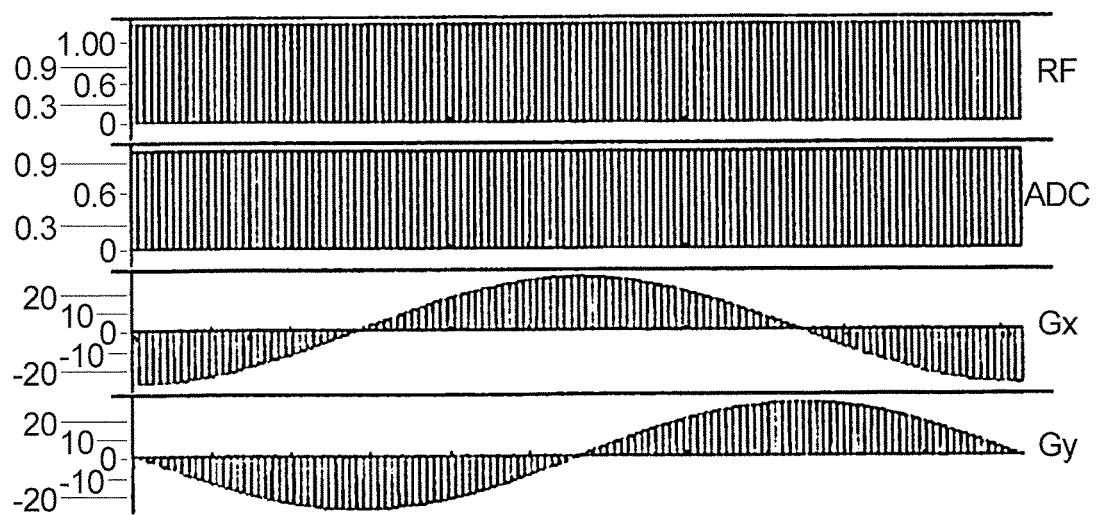
FIG. 12 shows a pulse sequence diagram for CEA that is suitable for use in accordance with the present invention.

FIG. 12 shows a pulse sequence diagram for CEA with 128 radial projections. Single TR interval timings with gradient ramp times are as shown in FIG. 11 with TR value of 1000 ms.

A 5 cm length rubber with 2 mm diameter holes which is measured to have a T2* of 60 us is used as phantom for 2D UTE and CEA. For UTE sequence, radial inside out k space trajectory with 128 radial projections of the rubber onto xy plane are acquired with RF pulse duration 100 us and peak voltage 30V, maximum gradient amplitude 24 mT/m, and acquisition bandwidth is 980 Hz/pixel. Pulse sequence diagram is shown in FIG. 12. Acquired raw data is mapped onto a Cartesian grid of size 128×128 for $[-k_{max}, k_{max}]$ using a home-made zero order gridding algorithm developed in MATLAB (The MathWorks, Natick, Mass.) which assigns the average value of 8 closest samples in non-uniformly sampled k-space data to a point on the Cartesian grid. Inverse 2D FFT is applied afterwards. For CEA sequence, the same k-space sampling trajectory is employed. Chirp RF pulse of 0.5V with 4.2 ms duration and 4.2 kHz sweep range is applied and acquisition is started 200 us after RF starts. Reconstruction of CEA data starts with subtracting the remaining. RF leakage induced in the receive coil. Deconvolution of the expected MR signal with the applied RF field is done afterwards for each line projections. The rest is the same gridding approach as in the UTE case. It should be noted that no filters or any other signal processing is applied to the raw data except the RF leakage subtraction, deconvolution, and the zero-order gridding operations.

In case of imaging mixtures of samples with long and short T2 values it is possible to excite only the spins with short T2 value by off-resonant excitation. Since the spins of short T2 value have broader resonance bandwidth, excitation bandwidth can be shifted such that spins with long T2 value are not excited. Note that off-resonance shift must account for the existence of gradient waves as well. In order to extract only the samples with long T2, either sweep range could be decreased or acquisition time can be extended with a time delay between the excitation and acquisition enough for spins of short T2 value decay.

Gradients forming the radial k-space trajectory can be designed such that instead of switching gradients on and off to acquire projections along different angular directions, by changing gradient levels only, the same projections could be acquired. If the gradient level is changed immediately after one projection is acquired and kept on for a certain time interval until the next acquisition starts, spins that are excited will be spoiled and the effect of the previous excitation will not last during the next excitation. This continuous gradient approach can be applied to 2D and 3D imaging with k space trajectories that do not necessitate switching the gradients on and off.

Figure 4:
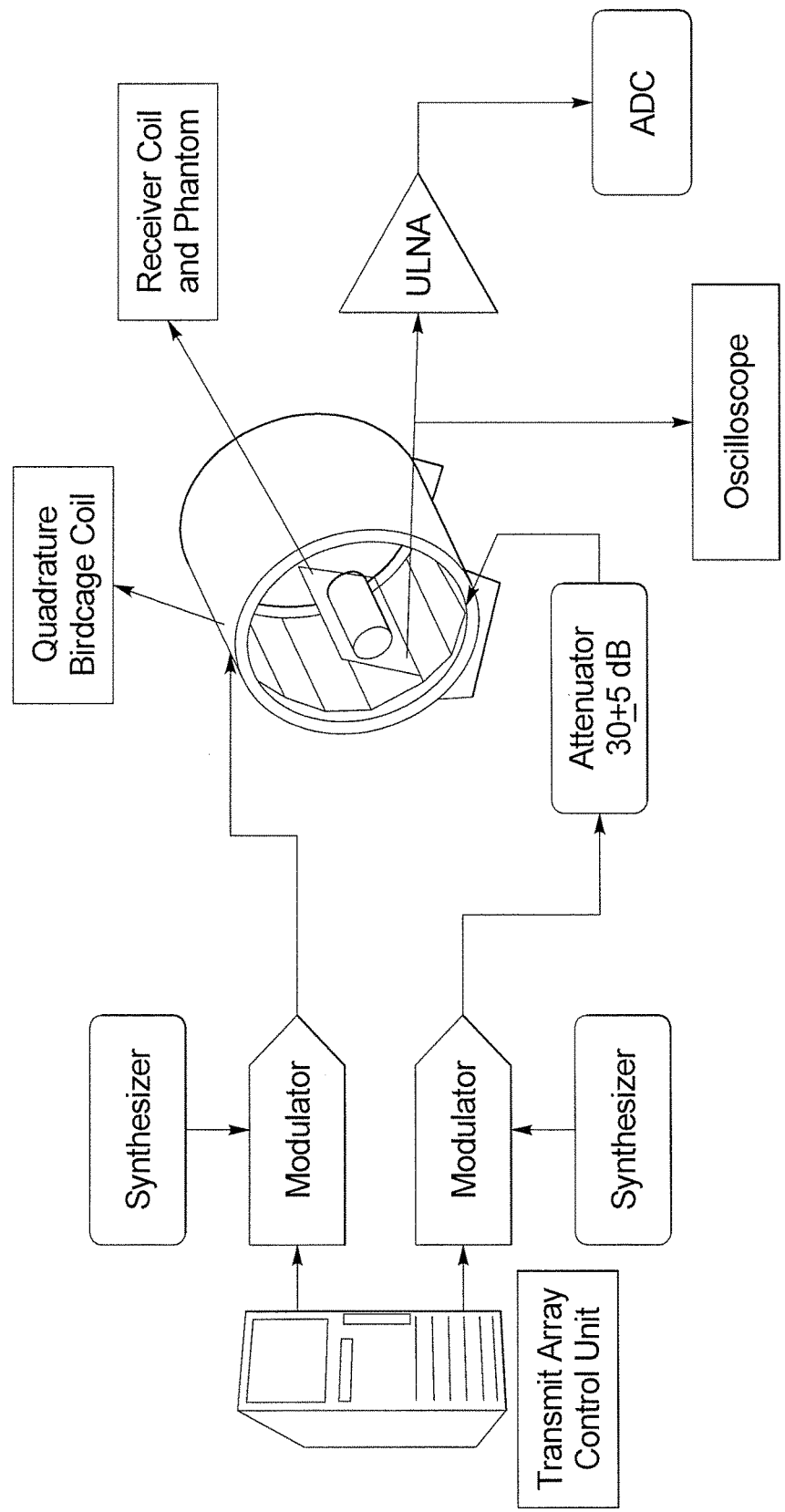
FIG. 4 is a system block diagram for a transmit array-controlled version of the MR imaging system according to the invention.

The experiments are conducted using Siemens Tim Trio 3T clinical scanner with transmit array unit. Block diagram of the setup that implements the decoupling methods explained above is shown in FIG. 4.

The two modulator-synthesizer pairs and attenuator can be replaced with one modulator-synthesizer pair with a power splitter with an appropriate ratio according to the achieved geometrical decoupling amount. One other alternative is to use FPGA based PWMs instead of synthesizer-modulator pair. Low-noise amplifiers can be inserted right after the modulators in order to increase achieved excitation field magnitude. Before the ULNA, optical data transmission can be used for the sake of eliminating circularly polarized fields coupled to coaxial cables on the receiver side.

The experimental procedure is as follows. First the modulator output of the two transmit channels are connected to two elements of the transmit coil array. A receive coil and sample within the rotation setup is placed orthogonally to one of the transmit channels while the voltage induced due to the coupled magnetic field from orthogonal transmit coil is checked by the oscilloscope. The other modulator output is attenuated to a voltage level where the induced voltage levels are set equal from two transmit channels. Voltage induced from both channels is measured and the phase value that minimizes the voltage induced in the receiver loop is calculated. By fine adjustment of the phase value as the sensitivity of the control unit allows the total voltage induced due to the transmit field is minimized. After that point, a third transmit coil can be connected and the magnitude and phase value can be adjusted to further reduce the total induced voltage. Once the voltage is reduced to the oscilloscope noise level, the standard MRI receiver unit is connected at the output and further adjustment can be proceed until the voltage based on the RF signal is reduced down the noise level. Rectangular shaped RF envelope is used in the experiments with the data acquisition is realized during RF excitation.

Results

Figure 5:
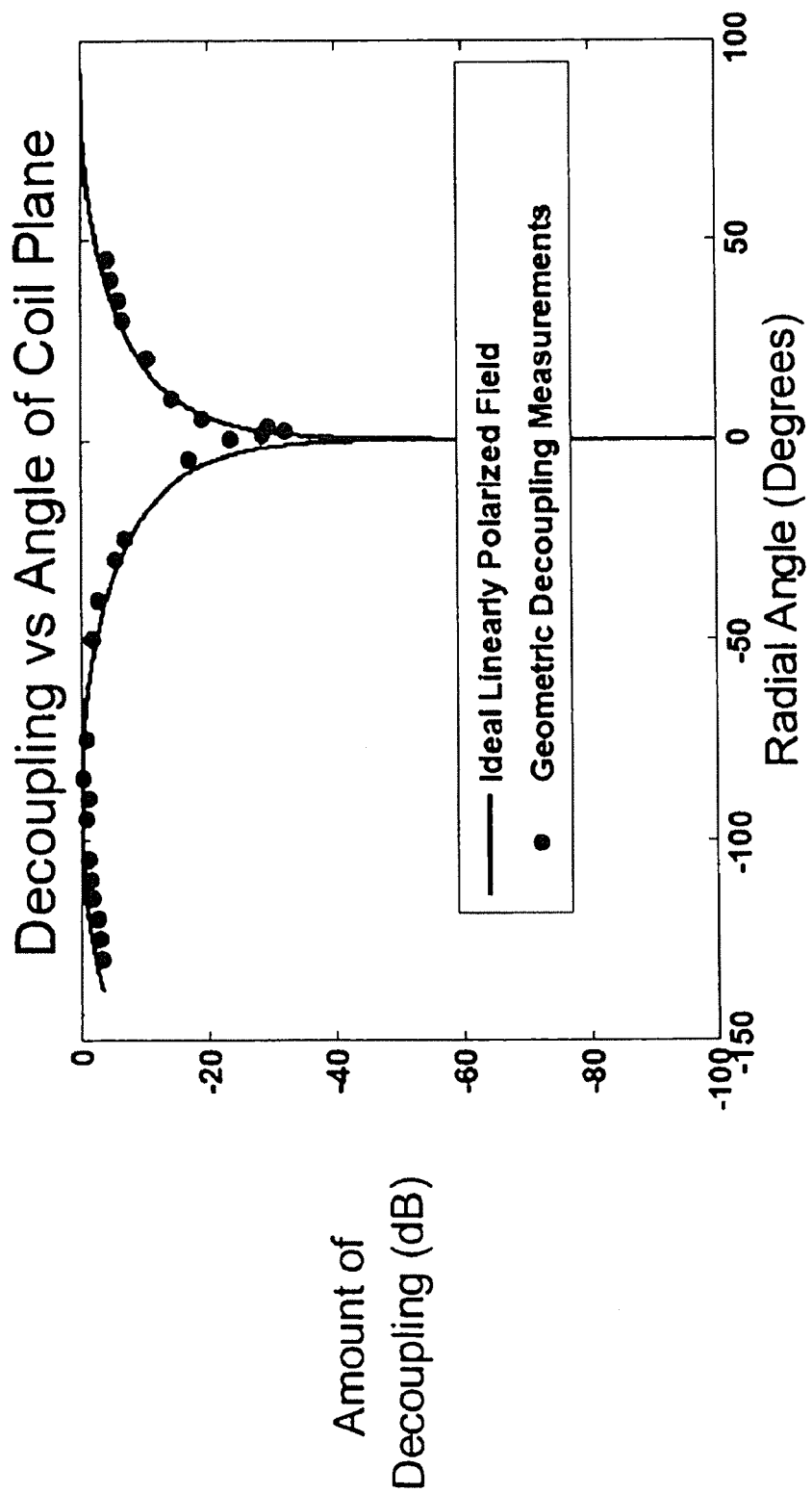
FIG. 5 shows linearly polarized magnetic field calculations and measurements with respect to angle of the receiver coil plane.

An MRI signal is obtained in the presence of an RF field as a result of the achieved decoupling. Decoupling over 80 dB was achieved using the method of two-step decoupling where geometrical decoupling and zero magnetic field steering are applied subsequently. At the beginning, the receiver coil loaded by a sample of copper sulphate solution was attached to the above-described rotation setup and placed in the MR scanner. Then, coil plane is rotated counter clockwise with a step size of 5 degrees. The voltage induced in the receiver coil, which is measured 200±20 $mV_{pp}$ at its maximum, is recorded by a digital oscilloscope. The rotation step size is reduced to 0.5 degree when needed in order to observe the induced voltage to be decreased. Resulting plot for geometric decoupling simulation and data is shown in FIG. 5.

Figure 6:
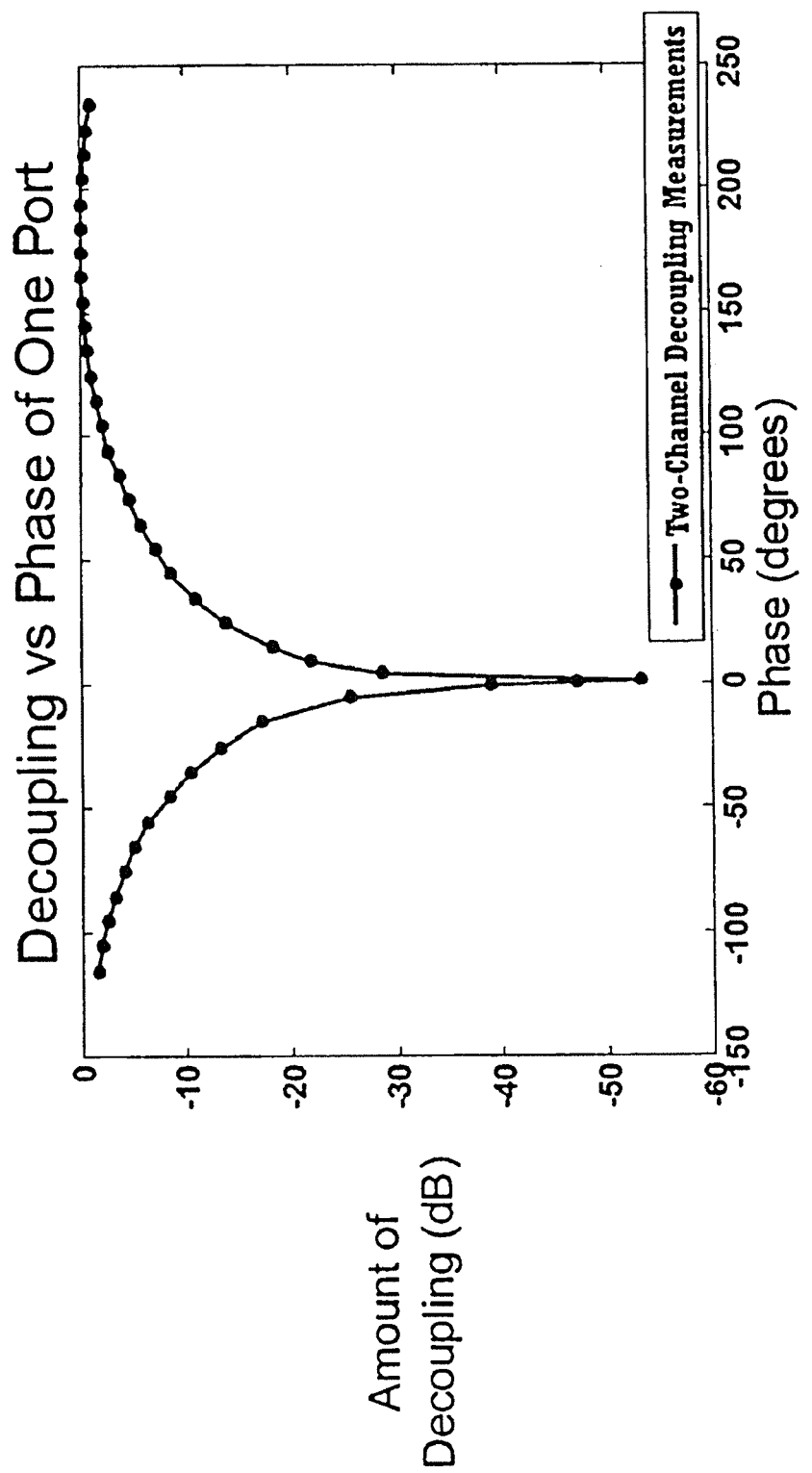
FIG. 6 shows decoupling amount measurements with respect to the phase of the second port of the birdcage coil.

Geometric decoupling is done for one RF generator unit connected to one of the channels of the birdcage coil. Then, the other channel of the RF generator unit is attenuated by the amount of decoupling achieved geometrically, since we need multiple RF generators to transmit RF signal having the same magnitudes so that a linearly polarized field is achieved and zero H field plane is steered into an appropriate radial plane by manipulating phases of RF generator units. Once a second RF generator unit is connected to the second channel of the birdcage body coil, we record the voltages induced by single channel transmission and double-channel transmission. Using the recorded data, the phase value corresponding to linear polarization having a zero magnetic field plane coplanar with the receiver coil plane is calculated. Observing the induced voltage, phase of one of the RF generator units is adjusted within possible precision via transmit array control unit. Initial voltage of 8±5 mV$_{pp}$ that corresponds to the voltage induced after the geometrical decoupling is reduced further to 100±μV$_{pp}$ using two-port decoupling that implements zero magnetic field steering. Induced voltage is recorded for a range of phase values at one RF generator unit with a step size of 10 degrees. Step size is reduced when needed. The resulting plot for achieved decoupling is shown in FIG. 6.

Figure 7:
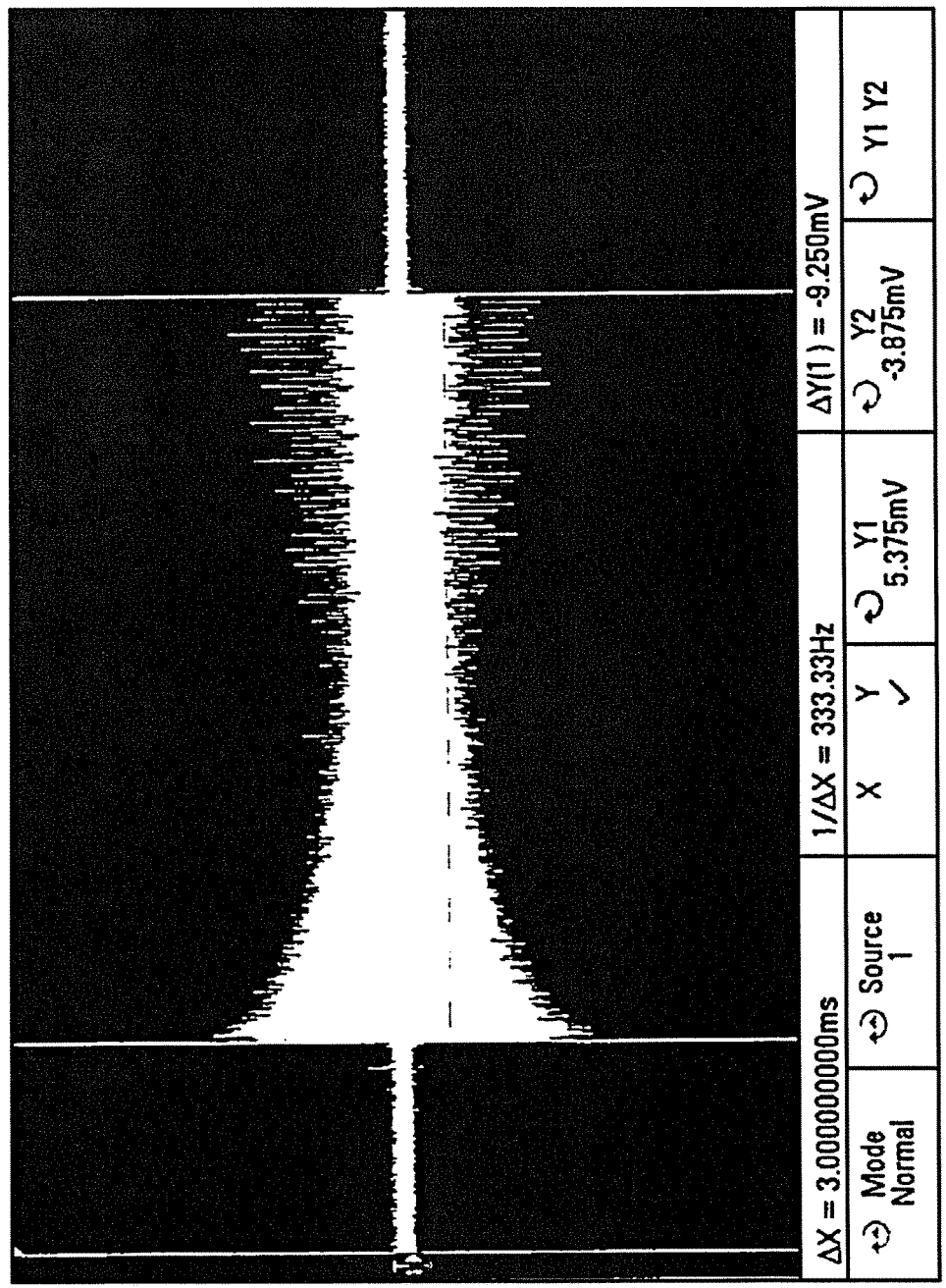
FIG. 7 shows that the delay between RF generator units causes induced voltage peaks at the boundaries of the envelope of the RF signal observed at the output of the receiver coil.

Performances of decoupling methods depend strictly on the sensitiveness of the rotation setup and the degree of precision of the RF generator phase adjustment unit, here determined by the transmit array control unit. In our system, we excluded RF power amplifiers from the setup because transistors of the amplifiers cause extensive noise to be generated during transmission when transistors are on. This problem is observed as a fluctuation voltage of 240 mV$_{pp}$ with a rectangular envelope induced in the receiver coil when RF is on. Therefore, transmit coils are driven directly from the modulator outputs having a peak voltage of 230±20 mV$_{pp}$. The fluctuation voltage level observed at the receiver coil is reduced to 2 μV with the aid of geometrical decoupling. Sometimes, a delay of 10 μs is observed between RF generator units which results in degradation in two-port decoupling performance. Voltage peaks may occur at the boundaries of the RF envelope due to delay between two ports as shown in FIG. 7. In addition, different RF sources have different noise characteristics implying that although we reduce the induced voltage through decoupling, we may not be able to reduce the noise, even increase the noise. As a result, the system introduced in this work is hard to implement using standard MRI systems and needs particular design considerations addressing all the challenges.

The concurrent MRI signal is obtained using the system explained herein. Sample data are shown in illustrations (b), (c) and (d) of FIG. 8, with data acquisition parameters explained as well.

Figure 8:
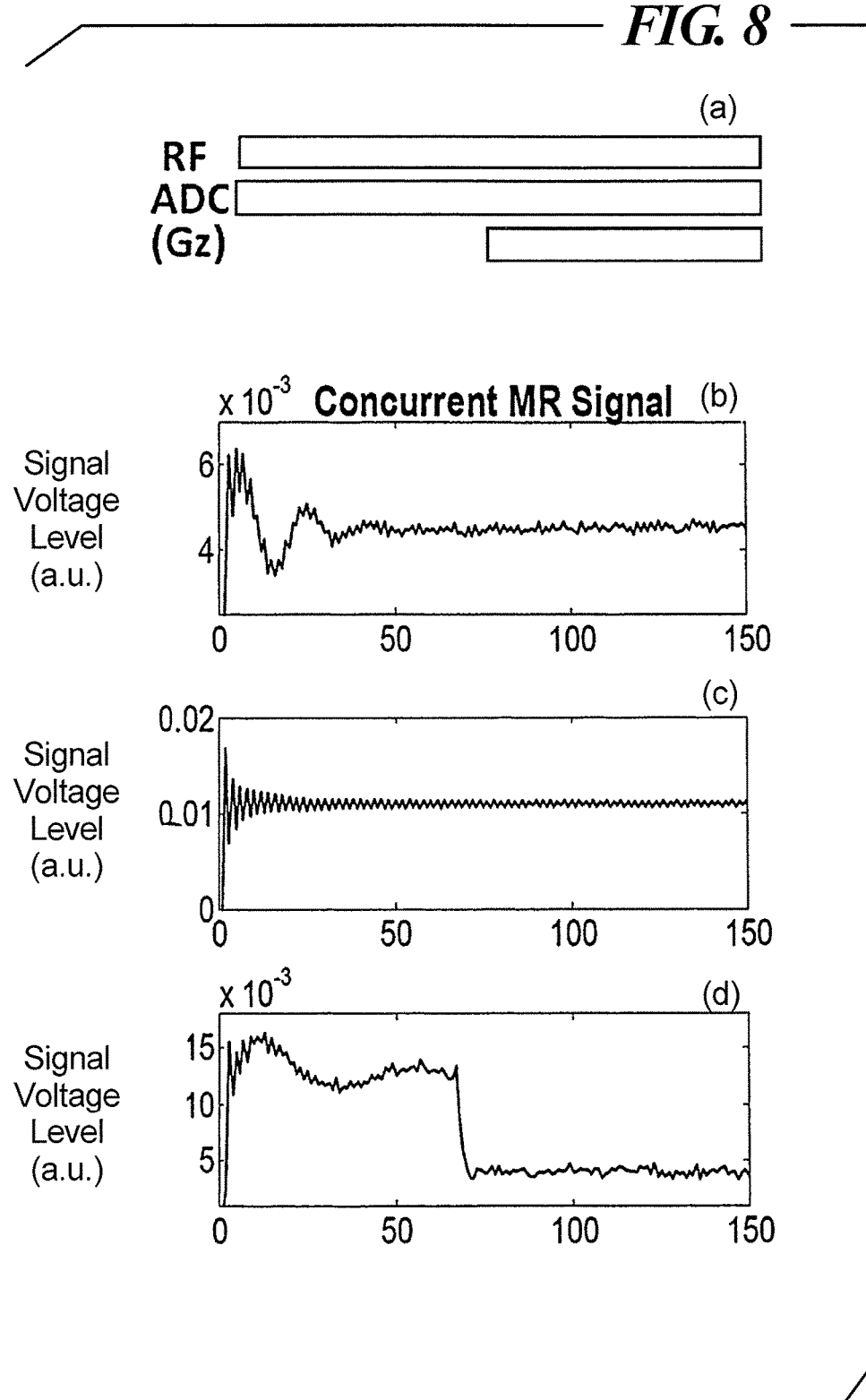

In illustration (b) of FIG. 8, the MR signal is shown that was acquired by operating the Siemens 3T Tim Trio Transmit array system in an MR scanner with the pulse sequence shown in illustration (a) in FIG. 8. The raw data were acquired with all the gradients are turned off, meaning that signal is acquired from the whole sample. When the basic magnetic field (B1 field) is increased, the frequency of the oscillation in the MR signal is observed to increase, as shown in illustration (c) in FIG. 8. Turning on slice selection gradients in the data acquisition chain, the MR signal decreases in magnitude, as shown in illustration (d) of FIG. 8. MR signals were acquired with 180 mV$_{pp}$ voltage transmitted from the transmit coils. Using the methods described herein, there is no need for post signal processing to detect the MR signal.

Using the MRI system described herein, the data acquisition strategy is quite new and conventional reconstruction methods will not apply. One suitable image reconstruction scheme utilizes constant gradients.

An image of the examination object will be reconstructed by multiplying the signal vector with the inverse of the B1 matrix followed by inverse Fourier transformation.

Figure 13:
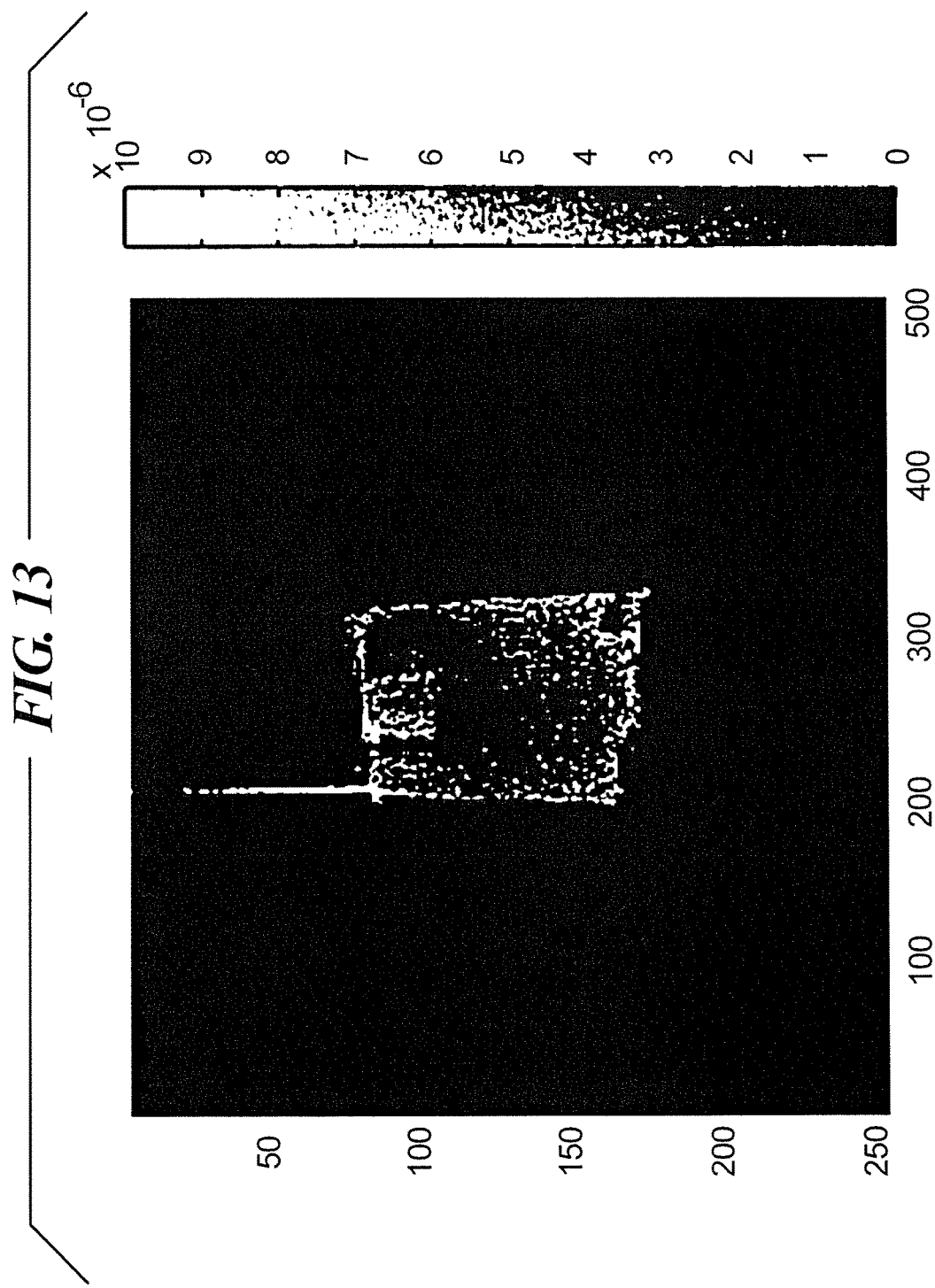
FIG. 13 shows a B1 map generated with the Bloch-Siegert shift method obtained with an experimental setup for testing the method in accordance with the invention.

B1$^+$ map for 20V reference input is shown in FIG. 13. Using the average B1$^+$ value of this experiment the achieved flip angle can be estimated with a linear mapping approximation between input transmit voltage and the B1$^+$ value. For a rectangular RF with 0.5V amplitude and 40 ms duration, the resulting flip angle is estimated as 15°. Note that the B1 map is generated for only the transmit channel with the higher input voltage. Therefore, it must be expected that the magnetization deviated from its intended orientation depending on the RF transmitted from the second transmit channel with a lower input voltage. The amount of the deviation must be smaller than 10% since there is a 20 dB difference between the input voltages of the transmit channels.

The B1 map shown in FIG. 13 was generated with the Bloch-Siegert shift method for 20 Vpeak Fermi input pulse with 4 kHz off-resonance. Rubber inside a glass of tap water was used as a phantom. The average B1$^+$ value is calculated as 4 μT.

The concurrent MRI signal is obtained by using a transmit array system to achieve the isolation task. Experimental results are shown in below figures. In the first experiments transmit coils are driven by on-resonant RF waveform with rectangular envelope and 2 mW RF input power is transmitted. In FIG. 13, the raw data is acquired with all the gradients are turned off, meaning that signal is acquired from the whole sample. Turning on slice selection gradient in the data acquisition chain, the MRI signal decreases in magnitude (FIG. 14).

Figure 14:
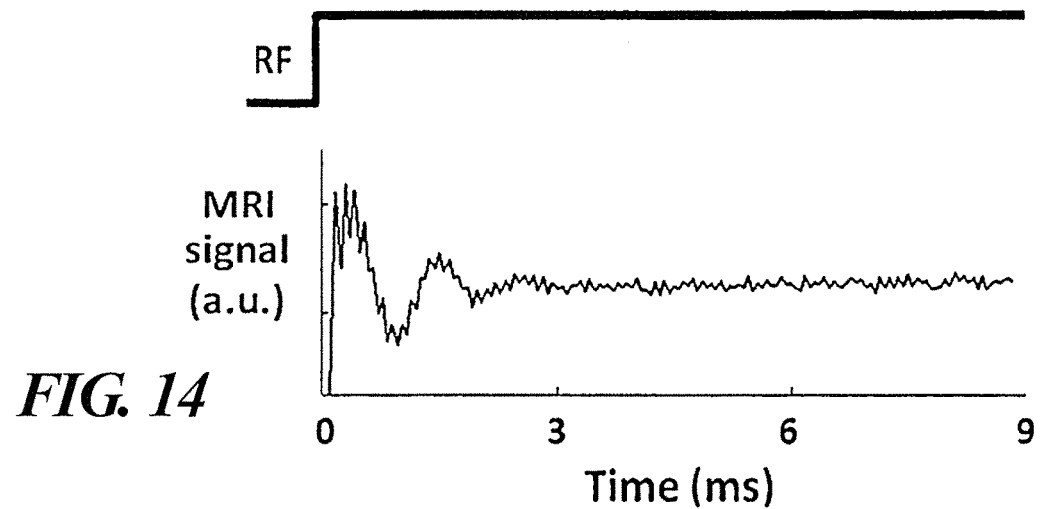
FIG. 14 shows a timing diagram for CEA in accordance with the present invention.

As shown in FIG. 14, concurrent MR signals were acquired using 3T transmit array system with TR=1000 ms, resolution=512, acquisition BW: 50 Hz/Px. The data are unprocessed raw data including B1 induced voltage signal remaining after decoupling. If leakage is higher the oscillations due to magnetization induced signal would be invisible. Since there is no gradient applied, the signal is accumulated all over the sample volume.

Figure 15:
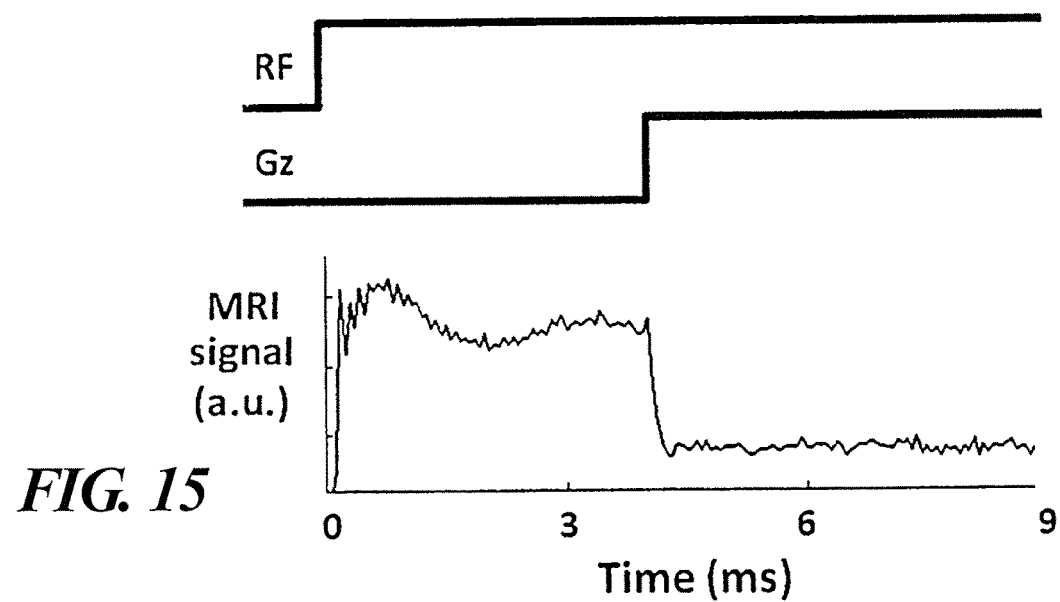
FIG. 15 shows a further timing diagram for CEA in accordance with the present invention.

As shown in FIG. 15, concurrent MR signals were acquired with 20 mT/m slice selection gradient turned on at t=4 ms. Turn on of a strong gradient causes the signal level to drop immediately. the space encoded information can be extracted with weaker gradients and higher B1 applied. In this experiment. the input RF power was 0.5 mW.

The fluctuation voltage level observed at the receive coil is reduced to 30 μV with the aid of geometrical decoupling. Delay of 10 μs is observed between RF generator units which results in degradation of decoupling at the beginning and at the end of the RF envelope. Therefore, data acquisition is started 100 μs after the RF is turned on. B1 value is estimated as 0.2 μT using Bloch-Siegert shift method assuming B1 is proportional to the input RF peak to peak voltage level.

Figure 16:
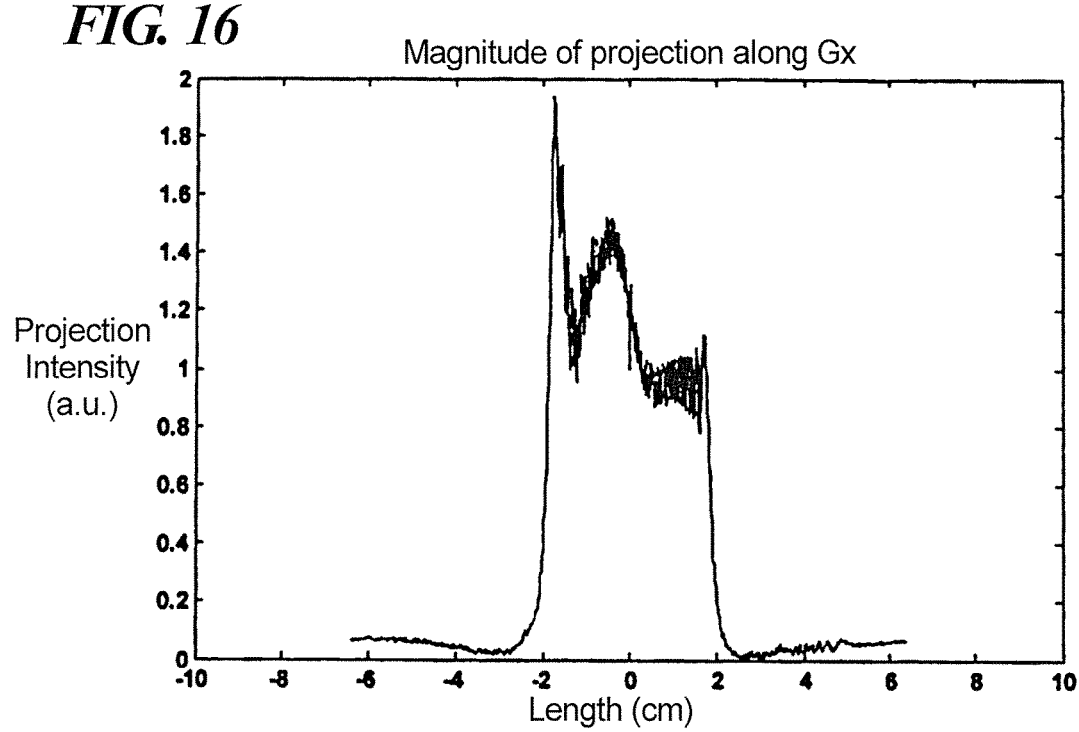
FIG. 16 shows the projection of a water and fat phantom acquired during testing of the inventive method.
Figure 17:
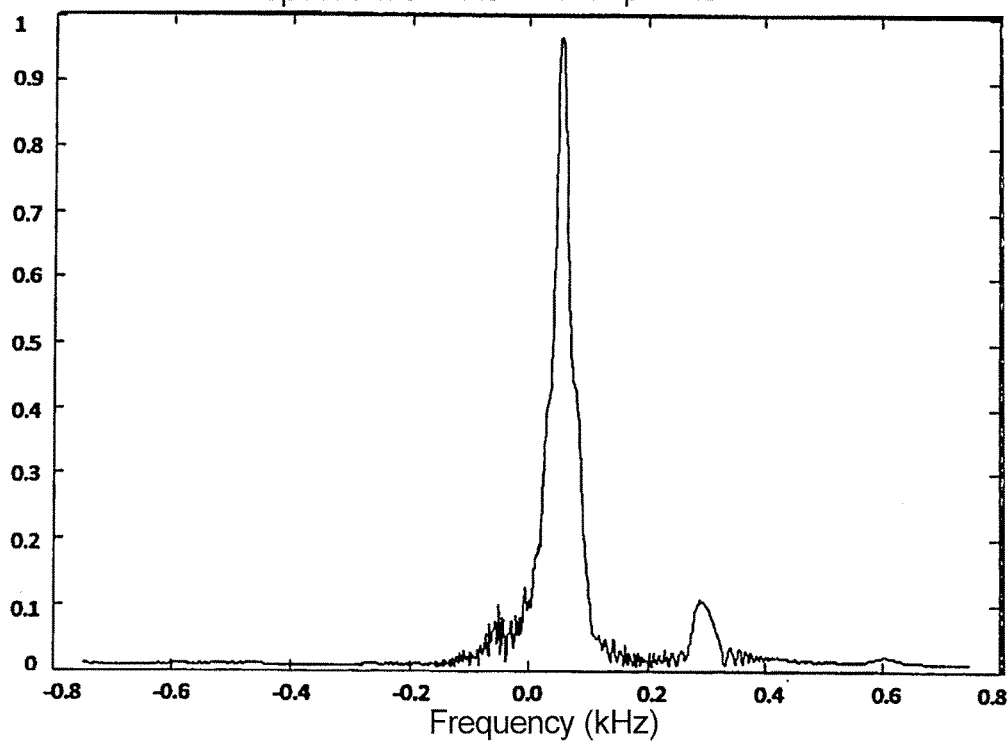
FIG. 17 shows the spectrum of a water and fat phantom acquired during testing of the inventive method.

In order to increase the signal level we have inserted a 5 W LNA of 15 dB gain and 3 dB noise figure after the modulator output of one of the transmit channels. FIG. 16 corresponds to the case that small circular loop is loaded with tap water with oil phantom projected along the gradient direction with a gradient level of 2 mT/m. The graph in FIG. 17 is obtained as the spectrum of tap water phantom with olive oil in the middle along for sweep rate of b=2.5 msec$^{-2}$.

Figure 18:
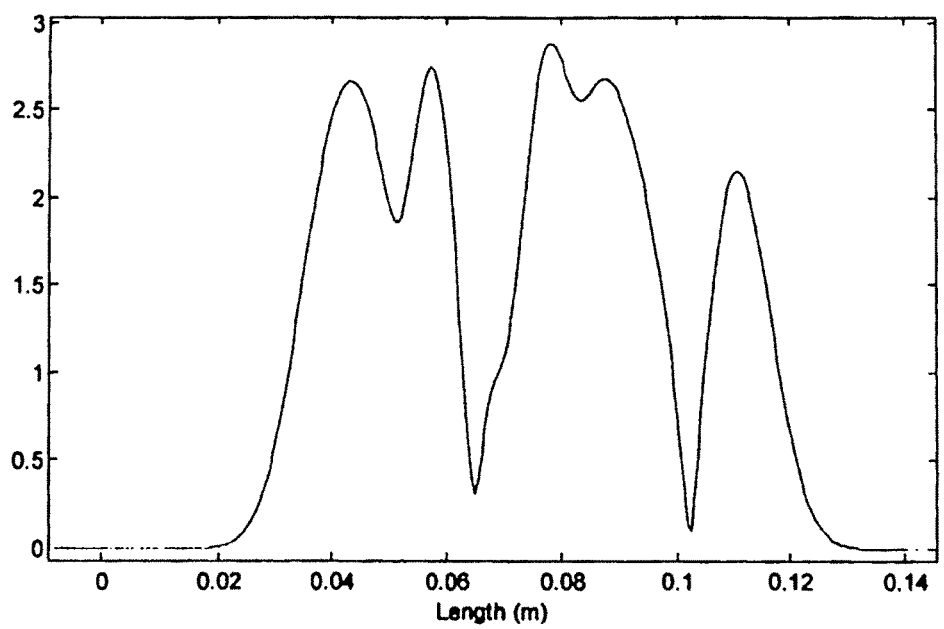
FIG. 18 shows the projection of three rubber phantoms acquired during testing of the inventive method.
Figure 19:
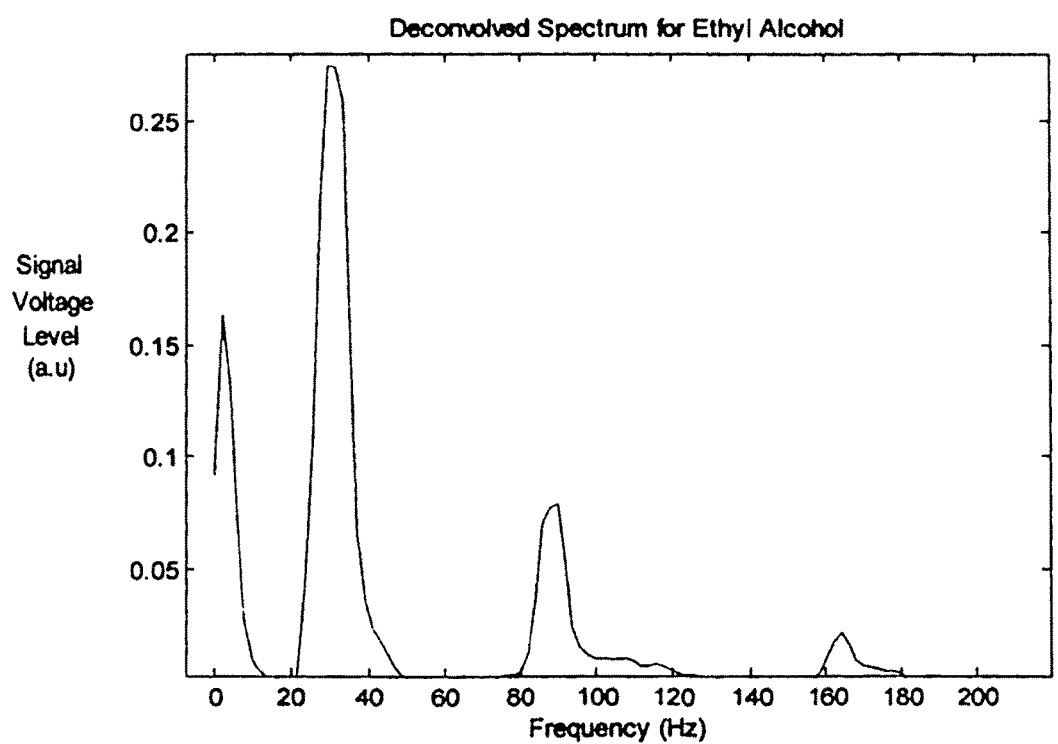
FIG. 19 shows the spectrum of a phantom composed of water and ethyl alcohol solution acquired during testing of the inventive method.

FIG. 18 is calculated for the projection of the rubber with $b=0.5$ msec$^{-2}$. FIG. 19 shows the spectrum for ethyl alcohol and water solution produced for $b=0.5$ msec-2.

FIG. 18 shows the projection of three rubber phantoms placed 1 cm distant to each other acquired with $Gx=2$ mT/m and acquisition duration of 40 ms and sweep range of 2 kHz. There I a sharpness problem observed due to short $T_2$ value the phantom has, yet three peaks could be observed as clue of existence of the three distant objects.

FIG. 19 shows the spectrum of water and ethyl alcohol solution phantom for acquisition duration of 40 ms and sweep range of 2 kHz. The rightmost peak is related to on resonant water phantoms. The remaining three peaks correspond to oxygen, ethylene and ethyl groups in the ethanol molecule.

In FIG. 16, two peaks can be seen corresponding to water and fat 1H peaks in the deconvolved spectrum of water-fat phantom. In FIG. 15 the projection of the water-fat phantom along x direction is obtained with a cylindrical shape deviating in the middle due to the existence of fat content put in the water, as expected. In FIG. 18, the spectrum of water-ethyl alcohol solution is obtained with a lower sweep rate, $b=0.5e6$ sec-2 corresponding to sweep of 2 kHz in 40 ms. The peaks corresponding to hydrogen groups in ethylene and water can be seen. Finally, in order to demonstrate the use of the method according to the invention for imaging of solids, the projection is shown of three rubbers placed in 1 cm distant to each other along x direction. Although it is not so clear the separation between rubbers, the peaks corresponding to the place of each rubber can be observed.

Figure 20:
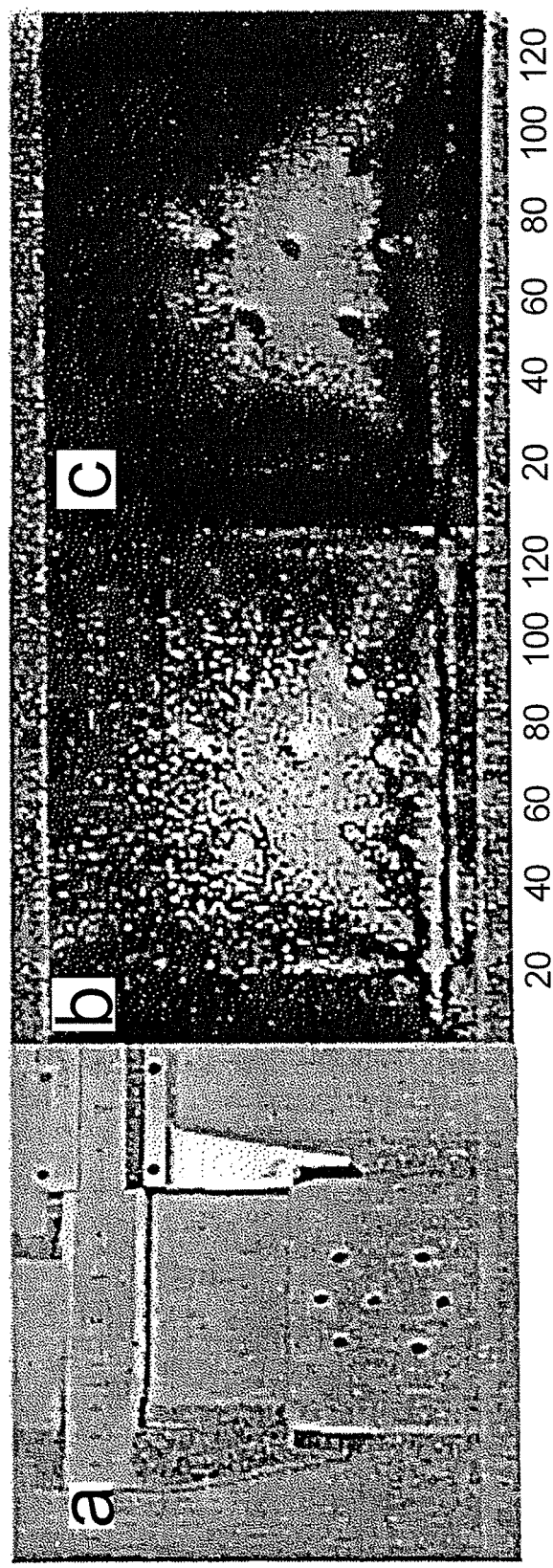
FIG. 20 shows images of phantoms with holes therein in image a, a UTE image b, and a CEA image c, acquired in accordance with the present invention.

Images for UTE and CEA sequences are reconstructed from obtained data are shown in FIG. 20. There are artifacts due to the projection reconstruction method employed not being particularly powerful. The center of k-space is also missed in UTE data which result in center brightening artifact. It is expected that the time delay between the RF turn off and acquisition start would be decreased with increasing amount of decoupling. In fact, a time delay of 10 us between the transmit channels which resulted in spikes at the end of the RF pulse is observed and we had to put a 10 us time delay at the end of the RF before setting out the acquisition in UTE sequence. However, the dots and the edges as high frequency information are represented in the image. The epoxy plate under the rubber can be seen. For the CEA image, the center of k-space is not missed since the spins are not dephasing during RF excitation. Therefore, a smoother image occurs and the holes are distinctive, but the edges are lost. Transmit noise induced voltage is measured to be lower than the receive noise floor.

It should be noted that no filters or any other linear operations applied to the raw data in post processing except the RF leakage subtraction and deconvolution operation. For the acquired raw data with UTE approach a deconvolution operation with an exponential decay of time constant T2 of the sample plus a constant could be applied in order not to amplify the noise and to further improve the image quality. Imperfections in the spectrums and projections will be discussed in the next section. These results are preliminary results demonstrating the feasibility of our method.

Summarization

An object of the tests that were conducted was to find a generalized reconstruction procedure applicable to a wide range of samples for a wide range of input RF waveforms. The preliminary results show that this object was achieved. More experiments imaging wide range of samples with various input RF waveforms can be implemented to develop a promising reconstruction algorithm. It is a significant contribution to the field to define suitable approximations for each region of relaxation parameters instead of putting limitations to the sequence parameters.

The effect of transmit coil with weaker B1 field on the MRI signal will be observed as a residual in the magnitude of the magnetization. This effect was not included in the analysis described herein, since it is a minor effect. However, the effect of multiple coil transmission on the magnetization vector must be analyzed in detail for a more rigorous treatment of the acquired signal.

The above results demonstrate the UTE and CEA sequences using a transmit array system and the decoupling over 70 dB is achieved which eliminates the need for a detuning diode in the receive coil. Subtraction of MRI signal and $B_1$ induced voltage is still required for image reconstruction of CEA. Advantages of CEA sequence are that it has much lower peak power and true zero echo time. Use of very low RF input powers could also be significant for some applications. The isolation method presented in this work is a potential solution to receiver dynamic range problems in implementation of CEA. Further isolation between MR signal and RF is achieved compared to other methods. Use of more than two transmit coils would help further reduction of remaining $B_1$ induced voltage after two-port decoupling. However, coupling between transmit coils should also be considered carefully.

Improving the decoupling, signal level in concurrent excitation and reception experiments will be increased significantly. The system introduced in this work stands for a promising system for implementation of NMR applications such as ultra-short TE imaging, continuous wave MRI and a powerful alternative for concurrent excitation and reception methods such as sideband excitation and continuous swift.

In the MRI system described herein, the isolation between transmit RF field and the MRI signal is achieved by magnetic field decoupling. Therefore, different from other methods, in this method both RF excitation and signal acquisition can be set on resonant. This method provides wide range flexibility for the applied RF field. As long as transmit array elements are fed by the same amplitude modulation characteristics the magnetic field decoupling could be achieved by the method presented in this work. The same argument is valid for the frequency modulation if it is used.

Time interleaved approach in MRI results in limitations in echo time due to gradient and RF coil switching times, coil ring down times and acquisition bandwidth. The idea of concurrent excitation and reception overcomes those problems due to its intrinsic property of zero echo time. Concurrent excitation and reception using magnetic field decoupling with transmit array enables the detection of on resonant MRI signal during on resonant excitation. Therefore, there will be no need for RF coils to be turned off but the receiver unit can acquire signal at any time point and acquisition bandwidth is not limited. In addition, concurrent excitation and reception provides us with the knowledge of spin properties during excitation. Since excitation lasts much shorter than the relaxation, imaging using spin parameters identifying excitation characteristics will take shorter in time.

Signal to noise ratio (SNR) is proportional to square root of acquisition duty cycle. (Macovski, A. (1996), Noise in MRI. Magn. Reson. Med., 36: 494-497. doi: 10.1002/mrm.1910360327) Using concurrent excitation reception approach in MRI signal can be acquired during excitation continuously without a need for interrupting acquisition channels. Availability of acquisition of MRI signal for 100% of the experiment stands for a promising enhancement of SNR compared to time interleaved excitation and acquisition schemes.

Transmit field noise disrupts the linearity of the polarization of the obtained RF field. Therefore, RF generator unit should have low noise characteristics. Especially the transistors in high voltage power amplifiers have high noise figure which results in the input noise to be elevated and delivered to the transmit coils. Therefore, in the MRI system described in this work, use of low noise elements is a key point for successful implementation of magnetic field decoupling. It is not possible to decouple RF noise emitted from independent noise sources.

In order to avoid their extensive noise contribution power amplifiers can be extracted from the setup and FPGA controlled pulse width modulation (PWM) based RF generators can be used instead if phase noise could be handled within reasonable limits. FPGA controls the switching transistor and the pulse width for switch-on state determines the amplitude of the RF signal transmitted while the delay of FPGA pulse train determines the phase of the RF output. Note that it is possible to use a sinusoidal voltage source instead of a constant DC voltage for the sake of efficiency.

Replacing high voltage power amplifiers, which require massive hardware covering large space with extra equipment such as chilling units, with small and simple structures such as FPGA based PWM sources the possibility of placing the RF generator units inside the scanner room near the transmit coils. Such a modification in the RF transmit system is advantageous over the standard system as it overcomes the cable based problems. Besides, the need for extra spaces allocated for massive large-cased elements disappear.

For a standard system with a transmit noise level high enough to disturb magnetic field decoupling the use of geometric decoupling helps the noise as well as the RF signal coupled in the receiver coil to be reduced although the excitation of sample will remain noisy anyway.

Other than thermal noise, there may be some other interference causing distortions in the transmitted RF signal such as voltage fluctuations, modulator based frequency shifts, phase noises based on oscillator infidelities . . . etc. Such distortions and noise are hard to deal with when they are emitted from independent sources. Use of a single RF generator unit with a power splitter is a useful approach that cancels RF generator unit based abnormalities. For example, field of two transmit coils fed up by one RF generator unit with a power splitter will cancel the abnormalities as well as magnetic fields coupled in the receiver coil because identical abnormalities are delivered to both coils.

An RF generator unit design based on digital synthesizer controlled by FPGA can be used in the transmit array to achieve magnetic decoupling task. Such a design provides flexibility in many applications and multiple channel transmission tasks can be controlled on an ordinary computer though a fast data connection. (Stang P. P., Pauly M. J., Scott G. C. Medusa: A Scalable MR Console Using USB. IEEE TRANSACTIONS ON MEDICAL IMAGING 2012. 31, 2: 370-379.) For a better performance in magnetic field decoupling and concurrent excitation reception tasks RF signal voltage must be high enough to avoid the use of power amplifiers. Low noise power amplifiers may also be developed in case of need for higher transmit peak voltage values.

RF power transmission through cables for long distances cause RF power loss and unwanted signals to be coupled in the cables despite shielding, Faraday cages or BALUNs. Coupling between the cables will always be problematic and especially coupling between receive and transmit cables reduce the performance of magnetic field decoupling. Transmit coils can be driven by compact RF generators which are placed in the scanner room right next to them instead of carrying RF power from an outside unit for long distances through coaxial cables. One RF generator can feed a group of transmit coils or individual generators can be connected to each transmit coil.

In order to avoid noise and effects of high static magnetic field, these generator units can be composed of FPGA controlled PWM based RF sources and high efficiency switching mode amplifiers replacing high voltage power amplifiers with high output noise voltage fluctuation s and massive chilling units.

A transmit array of more than two elements with increased linearity provides better decoupling performance. Geometric decoupling can also be implemented here by choosing the most appropriate coil array group instead of placing moving or rotating setups in the scanner. In addition, increasing the number of transmit array elements participating in decoupling task would increase the amount of decoupling achieved. In addition, SAR reduction methods can be applied if necessary.

As noted above, use of a single RF generator source feeding a few transmit coils has advantages since this design avoids the problems based on the use of different RF generators. There are plenty of possible ways of splitting power of a single RF source into multiple channels. We can generalize the design by a power splitter unit of three ports with a power ratio of R which indicates that power is divided into % R and 1–% R for two output ports. Key factors for design are isolation of output ports and appropriate impedance matching. Once the power is divided over the required ratio, a phase shifter is to be added to at least one of two output ports. There are plenty of ways of implementing a phase shifting. For our purpose it is best to design a phase shifter with variable adjustment of high resolution. Adjustable power division ratio can also be implemented for flexibility purposes. One way of implementing adjustable unequal Wilkinson power divider uses defectable ground structure with varactor diodes. (Lim J., Oh, S., Ahn D. A Power Divider with Adjustable Dividing Ratio. IEICE TRANS. ELECTRON. 2008. E91-C, 3: 389-391.) If geometric decoupling is applied as well, splitter ratio must be set up to compensate the difference between the amounts coupled from geometrically decoupled and non-decoupled transmit coils. For example, in a two transmit coil system, if one of the coils is decoupled 30 dB by geometrical means, than the power splitter ratio should be arranged as %99.9 to %0.1 so that steering zero magnetic field can be achieved by phase adjustment tool.

The idea of single RF generator unit with a phase adjusting power splitter can be implemented for all types of RF generator units. In case of FPGA controlled RF sources, digital phase shifters can also be used for the same purpose. Zero magnetic field plane of the linearly polarized field can be steered by any angle by adjusting the phase and amplitudes of the transmit coils properly.

Signal induced from the spins due to time derivative of total magnetization is amplified by a preamplifier circuit with a gain of 25 dB and noise figure of 0.8 dB. The increased signal is than modulated and the remaining baseband signal is delivered to the ADC that digitizes the signal, and the raw data is sent to image reconstruction system to form an image out of the MRI signal. In the data reception pathway unbalanced currents are formed unless the data transmission path has perfect symmetry. These unbalanced currents become more effective if there is an RF signal coupled in the receiver. In order to avoid unbalanced currents formed in the shield BALUN circuits are strongly recommended which suppress unbalanced currents by a significant amount.

Use of coaxial cables in signal transmission is a common way in most of the MRI applications. However, there problems of using coaxial cables such as heating and extra size of interconnections in case of a need for multiple elements in transmission or reception as well as the coupling among the cables. In order to resolve these problems, signal transmission can be carried out by a fiber optic line system with preamplifiers, laser diode, and matching circuitry. (Memis, O. G., Eryaman, Y., Aytur, O. and Atalar, E. (2008), Miniaturized fiber-optic transmission system for MRI signals. Magn. Reson. Med., 59: 165-173. doi: 10.1002/mrm.21462) For the MRI system described in this work, optical signal transmission is especially useful to avoid coupling of circularly polarized RF field components in the cables on the receiver side would reduce the performance of the decoupling. Besides, unbalanced currents would be reduced which is a problem of coaxial lines.

Another point of interest in design of such a receiver unit is the dynamic ranges of the components. If there is a need to increase the RF signal to a level that decoupling is not sufficient to suppress the RF signal coupled to receiver coil into an acceptable level, the preamplifier design should be improved to increase the linear range. ADC has also a dynamic range and it can be increased in a few ways. One possible way of improving dynamic range of ADC uses high sampling rates. There are ADCs commercially available with 16 bit resolution sampling at 100 Megasamples per second with increased dynamic range and signal to noise level. Use of high sampling rate ADCs allows digitization before demodulation. Therefore, demodulation can be implemented in digital domain, which is preferable against analog demodulation because quadrature analog receivers have problems with channel matching, dc offset and analog-to-digital linearity. (Hoenninger, J. C., III; Crooks, L. E.; Arakawa, M.; "A floating-point digital receiver for MRI," Biomedical Engineering, IEEE Transactions on, vol. 49, no. 7, pp. 689-693, July 2002 doi: 10.1109/TBME.2002.1010852) Such a modification in signal reception unit can be applied to optical transmission systems as well.

Existence of a multi-channel transmit array unit in the current system brings up the use of non-linear RF field for encoding purposes. Especially a transmit array system with a number of spatially distributed transmit coils is very useful for RF encoding which is reported to be an alternative to conventional signal encoding techniques using gradient fields. Excluding gradient fields helps avoiding gradient field based problems such as acoustic noise and peripheral nerve stimulation. (Katscher, U., Lisinski, J. and Bornert, P. (2010), RF encoding using a multielement parallel transmit system. Magn. Reson. Med., 63: 1463-1470. doi: 10.1002/mrm.22439) The MRI system described in this work can be used to generate spatial encoding RF field distribution.

Performances of decoupling methods depend strictly on the sensitiveness of the rotation setup and the degree of precision of the RF generator phase adjustment unit, here determined by the transmit array control unit. In our system, we excluded RF power amplifiers from the setup because transistors of the amplifiers cause extensive noise to be generated during transmission when transistors are on. This problem is observed as a fluctuation voltage of 240 mV$_{pp}$ with a rectangular envelope induced in the receiver coil when RF is on. Therefore, transmit coils are driven directly from the modulator outputs having a peak voltage of 230±20 mV$_{pp}$. The fluctuation voltage level observed at the receiver coil is reduced to 2 μV with the aid of geometrical decoupling. Sometimes, a delay of 10 μs is observed between RF generator units which results in degradation in two-port decoupling performance. Voltage peaks may occur at the boundaries of the RF envelope due to delay between two ports as shown in FIG. 8. In addition, different RF sources have different noise characteristics implying that although we reduce the induced voltage through decoupling, we may not be able to reduce the noise, even increase the noise. As a result, the system introduced in this work is hard to implement using standard MRI systems and needs particular design considerations addressing all the challenges.

For a possible clinical application of the CEA system presented in this work an automated system for decoupling can be developed. With an iterative optimization program checking the signal level of real time exported raw data and adjusting phase and amplitudes would decrease the preparation time. It would also be easier to re-adjust the parameters when the loading of the receive coil changes. An automated approach should include both geometric adjustment unit and a feedback system used in phase/amplitude levels and modulation characteristics adjustment units. Another use of the system described in this work is real time field/impedance monitoring by allowing the transmitted fields to be induced in the receive coils. If an automatic time variable decoupling system is developed, such a field monitoring function could be implemented without any modification to the system.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for acquiring magnetic resonance (MR) data, comprising:
    operating an MR data acquisition unit, comprising a transmit array and at least one reception coil, with an operating sequence in order to acquire MR data from a subject;
    in said operating sequence, radiating radio-frequency (RF) signals from said transmit array that excite nuclear spins in the subject, thereby causing MR signals to be emitted as a result of the excited nuclear spins, and detecting the MR signals with said at least one reception coil; and
    operating said transmit array in said operating sequence to cause said transmit array to be electromagnetically decoupled from said at least one reception coil during said detecting of said MR signals with said at least one reception coil.

2. A method as claimed in claim 1 comprising operating said transmit array to generate linearly polarized fields to produce said decoupling.

3. A method as claimed in claim 1 comprising concurrently emitting said RF signals from said transmit array and detecting said MR signals with said at least one reception coil.

4. A method as claimed in claim 1 comprising, in addition to operating said transmit array to electromagnetically decouple said transmit array and said at least one reception coil, geometrically decoupling said transmit array and said at least one reception coil.

5. A method as claimed in claim 4 comprising geometrically decoupling said transmit array and said at least one reception coil by arranging said transmit array in a plane that is orthogonal to a plane in which said reception coil is arranged.

6. A method as claimed in claim 1 comprising operating said MR data acquisition unit with an operating procedure for continuous wave magnetic resonance data acquisition, with concurrent excitation of said nuclear spins by said transmit array and detection of said MR signals with said at least one reception coil.

7. A method as claimed in claim 1 comprising operating said MR data acquisition unit to acquire said MR data with an operating sequence that does not include activation of a gradient field in said MR data acquisition unit.

8. A magnetic resonance (MR) apparatus for acquiring MR data, comprising:
an MR data acquisition unit comprising a transmit array and at least one reception coil;
a control unit configured to operate said MR data acquisition unit according to an operating sequence in order to acquire MR data from a subject;
a radio-frequency (RF) unit configured to operate said transmit array in said operating sequence, to cause said transmit array to radiate RF signals that excite nuclear spins in the subject, thereby causing MR signals to be emitted as a result of the excited nuclear spins, the MR signals being detected with said at least one reception coil; and
said RF unit being configured to operate said transmit array in said operating sequence to cause said transmit array to be electromagnetically decoupled from said at least one reception coil during the detection of said MR signals with said at least one reception coil.

9. A magnetic resonance apparatus as claimed in claim 8 wherein said RF unit is configured to operate said transmit array to generate linearly polarized fields to produce said decoupling.

10. A magnetic resonance apparatus as claimed in claim 8 wherein said RF unit and said control unit are configured to concurrently emit said RF signals from said transmit array and detect said MR signals with said at least one reception coil.

11. A magnetic resonance apparatus as claimed in claim 8 wherein, in addition to said RF unit operating said transmit array to electromagnetically decouple said transmit array and said at least one reception coil, said transmit array and said at least one reception coil are geometrically decoupled from each other in said MR data acquisition unit.

12. A magnetic resonance apparatus as claimed in claim 11 wherein said transmit array is arranged in a plane that is orthogonal to a plane in which said reception coil is arranged.

13. A magnetic resonance apparatus as claimed in claim 8 wherein said RF unit and said control unit are configured to operate said MR data acquisition unit with an operating procedure for continuous wave magnetic resonance data acquisition, with concurrent excitation of said nuclear spins by said transmit array and detection of said MR signals with said at least one reception coil.

14. A magnetic resonance apparatus as claimed in claim 8 wherein said control unit is configured to operate said MR data acquisition unit to acquire said MR data with an operating sequence that does not include activation of a gradient field in said MR data acquisition unit.

15. A magnetic resonance apparatus as claimed in claim 8 wherein said RF unit comprises an RF generator comprising a phase and amplitude control module configured to produce said decoupling between said transmit array and said at least one reception coil, said phase and amplitude control module simultaneously providing signals to multiple transmit coils in said transmit array.

16. A magnetic resonance apparatus as claimed in claim 8 wherein said RF unit comprises an RF generator unit connected to a power divider module with a phase adjustment control unit, said power divider module being configured to split power from said power generator unit among at least two transmit coils in said transmit array, with respectively different phases.

* * * * *